(12) United States Patent
Murade

(10) Patent No.: US 6,770,909 B2
(45) Date of Patent: Aug. 3, 2004

(54) ELECTRO-OPTICAL DEVICE AND ELECTRONIC EQUIPMENT

(75) Inventor: Masao Murade, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/320,372

(22) Filed: Dec. 17, 2002

(65) Prior Publication Data

US 2003/0122125 A1 Jul. 3, 2003

Related U.S. Application Data

(63) Continuation of application No. 09/600,700, filed as application No. PCT/JP99/06642 on Nov. 26, 1999, now Pat. No. 6,521,913.

(30) Foreign Application Priority Data

Nov. 26, 1998 (JP) ............................. 10-336343

(51) Int. Cl.[7] ............................................. H01L 29/04
(52) U.S. Cl. ................... 257/59; 257/72; 257/88; 438/48; 438/128; 438/149; 438/151; 438/157; 438/283
(58) Field of Search .................. 257/57, 59, 62, 257/66, 69, 72, 88–93

(56) References Cited

U.S. PATENT DOCUMENTS

| | | | |
|---|---|---|---|
| 5,042,918 A | 8/1991 | Suzuki | 359/59 |
| 5,208,690 A | 5/1993 | Hayashi et al. | 359/59 |
| 5,515,187 A | 5/1996 | Nakamura et al. | 359/59 |
| 5,589,962 A | 12/1996 | Yamamoto et al. | 349/46 |
| 5,610,738 A * | 3/1997 | Sasano et al. | 349/43 |
| 5,686,980 A | 11/1997 | Hirayama et al. | 257/294 |
| 5,737,049 A * | 4/1998 | Shin et al. | 349/122 |
| 5,757,453 A * | 5/1998 | Shin et al. | 349/122 |
| 5,790,222 A * | 8/1998 | Kim | 349/139 |
| 5,818,550 A | 10/1998 | Kadota et al. | 257/59 |
| 5,844,255 A | 12/1998 | Suzuki et al. | 257/72 |
| 5,920,082 A * | 7/1999 | Kitazawa et al. | 257/59 |
| 6,147,667 A | 11/2000 | Yamazaki et al. | 257/59 |
| 6,188,458 B1 * | 2/2001 | Tagusa et al. | 349/138 |
| 6,226,059 B1 | 5/2001 | Yamamoto et al. | 257/59 |
| 6,310,669 B1 * | 10/2001 | Kobayashi et al. | 349/43 |
| 2002/0021378 A1 * | 2/2002 | Murade | 349/43 |

FOREIGN PATENT DOCUMENTS

| | | |
|---|---|---|
| JP | 04-291240 | 10/1992 |
| JP | 05-100250 | 4/1993 |
| JP | 05-181159 | 7/1993 |
| JP | A-6-67201 | 3/1994 |
| JP | 8-160463 A | 6/1996 |
| JP | A-8-160463 | 6/1996 |
| JP | 08-262494 | 10/1996 |
| JP | 09-026601 | 1/1997 |
| JP | 09-043639 | 2/1997 |
| JP | A-10-20298 | 1/1998 |
| JP | A-10-31235 | 2/1998 |
| JP | 10-31235 A | 2/1998 |

* cited by examiner

Primary Examiner—David Nelms
Assistant Examiner—Andy Huynh
(74) Attorney, Agent, or Firm—Oliff & Berridge, PLC

(57) ABSTRACT

An active matrix driven electro-optical device, such as a liquid crystal device, enabled to add sufficient storage capacitance to pixel electrodes and decrease the diameter of contact holes connecting with pixel electrodes even when a fine pixel pitch is employed. The liquid crystal device has TFTs, data lines, scanning lines, storage capacitor lines, and pixel electrodes provided on a TFT array substrate. Each of the pixel electrodes is electrically connected to one of the TFTs by two contact holes through a barrier layer. A part of a semiconductor layer and each of the capacitor lines sandwich a first dielectric film and constitute a first storage capacitor, while a part of the barrier layer and each of the capacitor lines sandwich a second dielectric film and constitute a second storage capacitor.

7 Claims, 16 Drawing Sheets

Fig. 5
(Step 10)
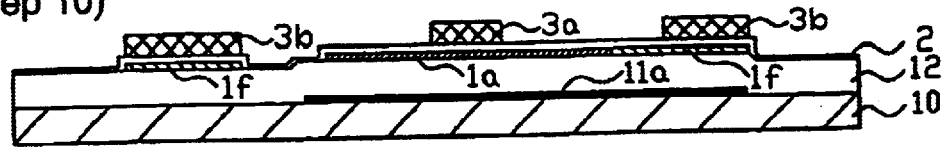
(Step 11)
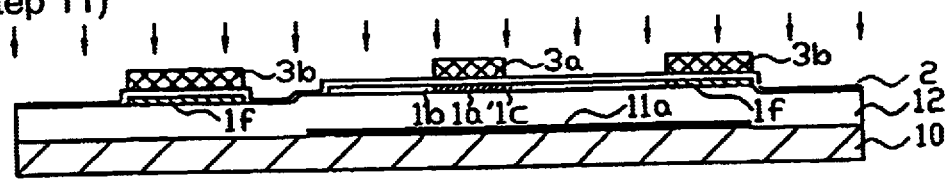
(Step 12)
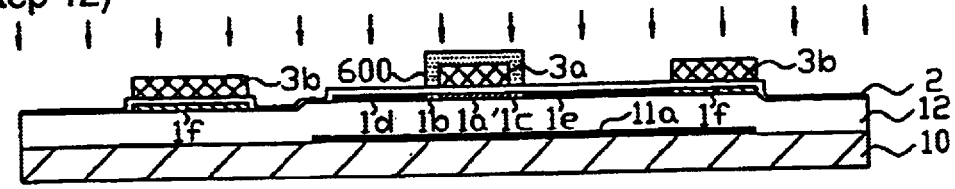
(Step 13)
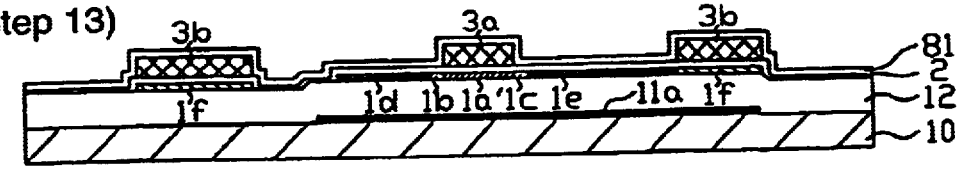
(Step 14)
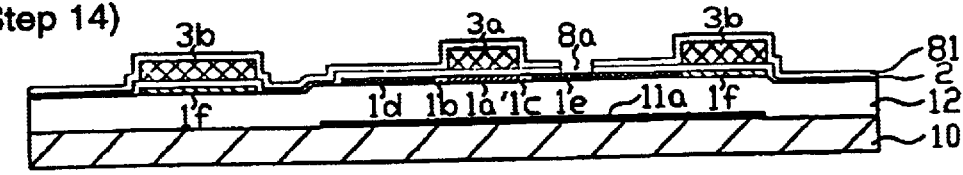
(Step 15)

Fig. 6
(Step 16)
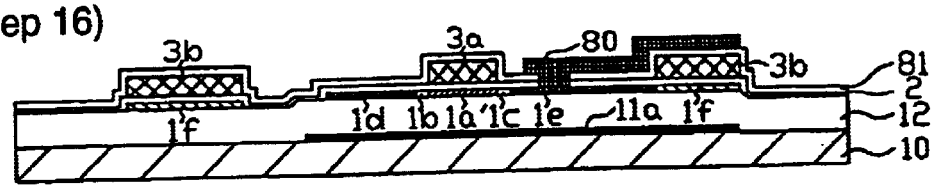
(Step 17)
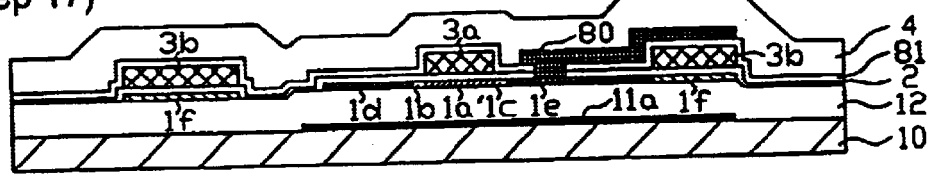
(Step 18)
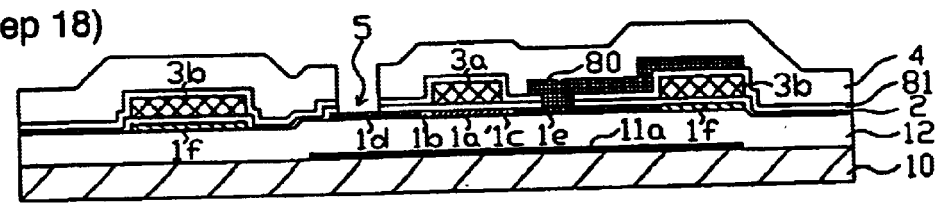
(Step 19)
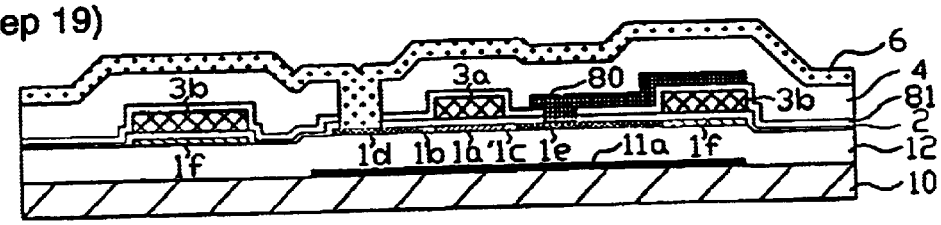
(Step 20)
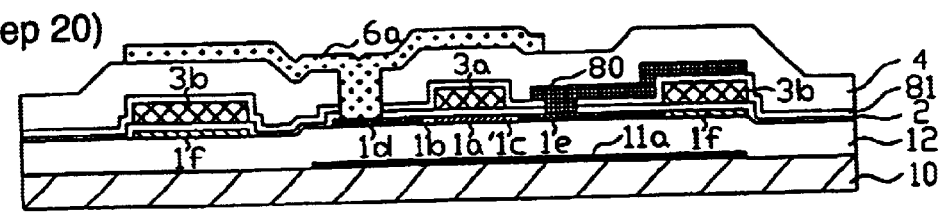

Fig. 7
(Step 21)
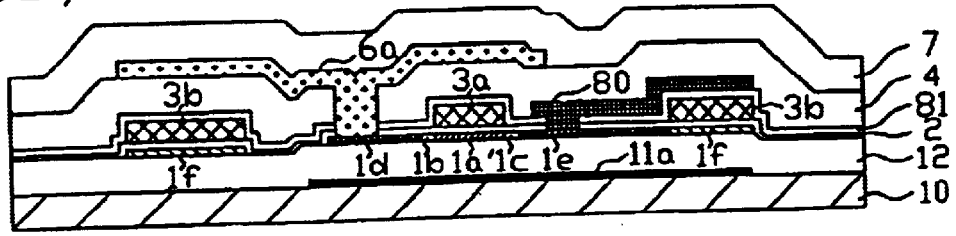
(Step 22)
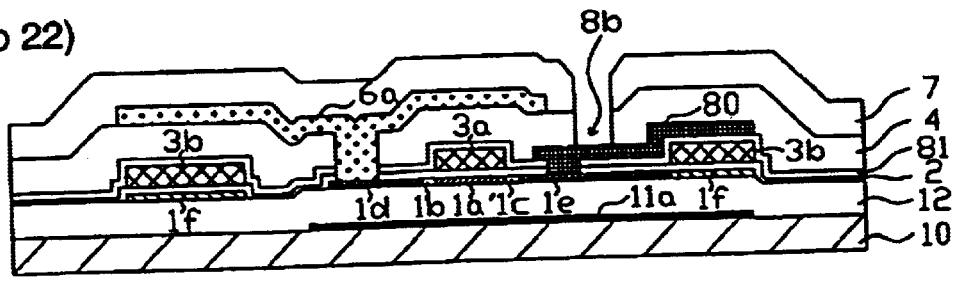
(Step 23)
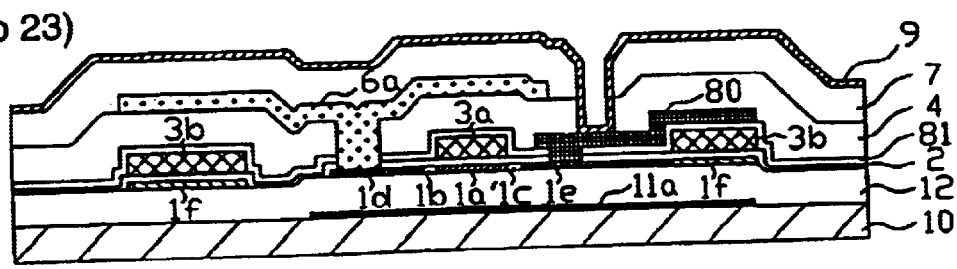
(Step 24)
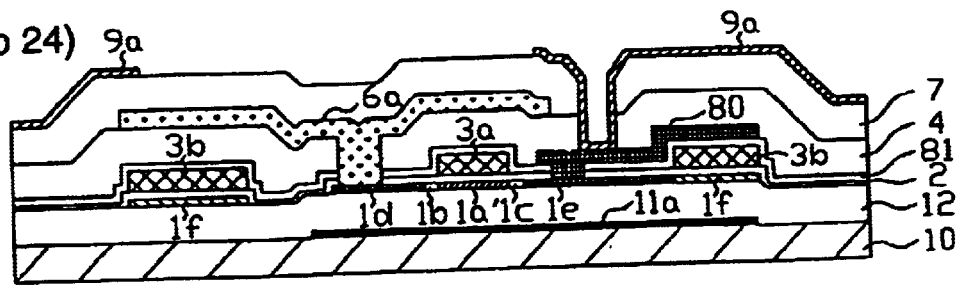

ELECTRO-OPTICAL DEVICE AND ELECTRONIC EQUIPMENT

This is a Continuation of application Ser. No. 09/600,700 filed Jul. 21, 2000 now U.S. Pat No. 6,521,413 which in turn is a U.S. National Stage of PCT/JP99/06642 filed Nov. 26, 1999. The entire disclosure of the prior application(s) is hereby incorporated by reference herein in its entirety.

BACKGROUND OF THE INVENTION

1. Field of the Invention

The present invention belongs to the technical field of an active matrix driven electro-optical device and a method for manufacturing the same, and more particularly, to an electro-optical device, which has storage capacitor electrodes for adding storage capacitance to pixel electrodes and which also has a conductive layer designated as a barrier layer for allowing favorable electrical conductance between a pixel electrode and a pixel switching thin film transistor (hereunder sometimes referred to as an TFT).

2. Description of Related Art

In a conventional active matrix TFT-driven electro-optical device, many scanning lines arranged along the columns of pixel electrodes, data lines arranged along the rows of pixel electrodes, and TFTs respectively corresponding to and disposed at intersections of the scanning and data lines are provided on a TFT array substrate. Each of the TFTs has a gate electrode connected to the scanning line, and also has a semiconductor layer, whose source and drain regions are respectively connected to the data line and the pixel electrode. Incidentally, especially, each of the pixel electrodes is connected to the drain region of the semiconductor layer of a corresponding TFT through a contact hole bored in an interlayer insulating film, because the pixel electrodes are provided on various kinds of layers of the TFTs and on the interlayer insulating film for insulating the pixel electrodes from one another. Further, when a scanning signal is supplied to the gate electrode of the TFT through the scanning line, the TFT is turned on. Moreover, an image signal supplied to the source region of the semiconductor layer through the data line is fed to the pixel electrode through the source-drain path of the TFT. Such supply of the image signal is supplied to each of the pixel electrodes through a corresponding one of the TFTs only for an extremely short time. Thus, generally, a storage capacitor is formed in each of the pixel electrodes in parallel with a liquid crystal capacitor so as to hold the voltage of an image signal, which is supplied through the TFT turned on for an extremely short time, for a time that is far longer than the extremely short time. On the other hand, in this kind of an electro-optical device, the source and drain regions and the channel region, which is formed between the source and drain regions, of each of the pixel switching TFTs are constituted by the semiconductor layers formed on the TFT array substrate. The pixel electrodes need to be connected to the drain regions of the semiconductor layers through a laminated structure containing wirings, such as the scanning lines, the storage capacitor lines, and the data lines, and a plurality of interlayer insulating films for electrically insulating these wirings. Incidentally, especially, in the case of staggered type or coplanar type polysilicon TFTs, each having a top gate structure in which a gate electrode is provided on a semiconductor layer, the interlayer distance from the semiconductor layer of the laminated structure to the pixel electrode is long, for example, about 1000 nm or more. It is, thus, difficult to form a contact hole for electrically connecting both the semiconductor layer and the pixel electrode. More specifically, it is extremely difficult to form such a deep hole only by dry etching, because of etching accuracy degradation that is caused by increasing the depth of a portion, on which the etching is performed, and that results in possibility of penetrating a target semiconductor layer to thereby form a hole. Thus, a combination of dry etching and wet etching is performed However, this wet etching results in an increase in the diameter of the contact hole. Consequently, it is difficult to lay out necessary amounts of wires and electrodes in a limited region on the substrate.

Hence, recently, the following technique has been developed. That is, when the electrical connection between the data line and the source region is provided by making a contact hole, which is led to the source region of the semiconductor layer, in the interlayer insulating film formed on the scanning line, a relaying conductive layer designated as a barrier layer is formed from the same layer as that constituting the data line on the interlayer insulating film by forming a contact hole led to the drain region of the semiconductor layer. Then, a contact hole guided to this barrier layer from the pixel electrode is formed in the interlayer insulating film formed on the data line and this barrier layer. Such a configuration, in which the electrical connection from the pixel electrode to the drain region is provided via the barrier layer constituted by the same layer as that of constituting the data line, a contact hole forming step is facilitated, as compared with the case of forming a contact hole in such a way as to be led from the pixel electrode directly to the semiconductor layer. Moreover, the diameter of the contact hole led to the drain region via the barrier layer is smaller than that of the contact hole led directly to the semiconductor layer.

In the case of such a conventional electro-optical device, there is a keen ordinary demand for enhancing the picture quality of a displayed image. It is extremely important in meeting such a demand to realize a highly fine image display region or a fine pixel pitch, and to attain a high pixel aperture ratio (that is, to enhance the ratio of a pixel aperture region, which transmits display light, to a non-pixel-aperture region, which does not transmit display light, corresponding to each pixel).

However, this kind of conventional electro-optical device has a drawback in that the pixel aperture ratio is low at a highly fine pixel pitch because there is an essential limit to the degree of fineness of each of the electrode size, wire width, and contact-hole diameter, which results from fabrication techniques, and that thus, the proportion of the area of a region which contains such wires and electrodes relative to the area of the image display region increases.

Furthermore, when the degree of fineness of the pixel pitch is enhanced in this manner, it is difficult to realize the aforementioned storage capacitor which has sufficient storage capacitance and is incorporated into the limited region on the substrate. Incidentally, particularly, according to the aforementioned technique using the barrier layer, the barrier layer is constituted by conductive film, such as Al (aluminum) film, which is the same as the conductive film constituting the data line. Thus, the degree of flexibility of forming a contact hole is low owing to the position and material of the barrier layer. Moreover, it is extremely difficult to use the barrier layer for purposes other than that of performing the relaying function. Particularly, it is impossible to simplify the configuration of the device and to enhance efficiency of a manufacturing process by making the most of each of the layers of the fine laminated structure. Additionally, according to this technique, a chemical reaction is caused by bringing the Al film constituting the barrier layer in contact with an ITO (Indium Tin Oxide) film constituting the pixel electrode. As a result, the readily ionizable Al film is subject to corrosion. This impairs the electrical connection between the barrier layer and the pixel electrode. Thus, it is necessary to use a high melting point metallic film, for instance, Ti (titanium) film, as a second barrier layer, so as to provide the favorable electrical connection between the ITO film and the second barrier layer. Consequently, this conventional electro optical device has a drawback in that the structure of the layers and the process of fabricating the layers are complexed.

The present invention is accomplished in view of the aforementioned drawbacks. A problem to be solved by the present invention is to provide an electro-optical device, which can favorably electrically relay between the pixel electrode and the thin film transistor and increase the storage capacitance by using a relatively simple configuration even when a fine pixel pitch is employed, and which also can display a high-picture-quality image, and to provide a method for manufacturing the electro-optical device.

SUMMARY OF THE INVENTION

To solve the aforementioned problems, according to the present invention, there is provided a first electro-optical device, which may include a substrate that has a plurality of scanning lines, a plurality of data lines, thin film transistors connected to the plurality of scanning lines and the plurality of data lines, and pixel electrodes and storage capacitors connected to the thin film transistors.

This first electro-optical device may further include a first interlayer insulating film formed above an electrode corresponding to one of the plurality of scanning lines and the plurality of storage capacitors, a conductive layer formed above the first interlayer insulating film, and a second interlayer insulating film formed above the conductive layer. The plurality of data lines are formed on the second interlayer insulating film.

According to the first electro-optical device of the present invention, electrodes of one of a group of scanning lines and a group of storage capacitors, a first interlayer insulating film, a conductive layer, a second interlayer insulating film, and data lines are formed on the substrate in this order. Therefore, the electrically conductive layer interposed between the scanning line and the data line can be utilized for various purposes. The semiconductor layer and the pixel electrode can be electrically connected through the conductive layer to each other by connecting, for instance, first, the conductive layer and the semiconductor layer through the first contact hole, and moreover, connecting the conductive layer and the pixel electrode through the second contact hole. Alternatively, storage capacitance can be imparted to the pixel electrodes by using a part of the conductive layer as a storage capacitor electrode facing a part of the semiconductor layer and the other of the storage capacitor electrodes through the dielectric film. Alternatively, at least a part of the opened region of the pixel can be defined with a conductive layer by forming the conductive layer from a light shielding film. Additionally, the data lines, the scanning lines, and other wirings other than the storage capacitor lines for one of the storage capacitor electrodes can be constituted by conductive layers. Further, the redundant wires of the data lines, the scanning lines, and the storage capacitor lines can be formed from conductive layers.

According to an embodiment of the first electro-optical device of the present invention, the substrate is further provided with a third interlayer insulating film formed on the data lines. The pixel electrodes are formed on the third interlayer insulating film and electrically connected to the conductive layer through the contact holes formed in the second and third insulating films. The conductive layer is electrically connected to the semiconductor layer.

In such a configuration, the pixel electrodes are formed on the data lines via the third interlayer insulating film. The pixel electrodes are electrically connected to the conductive layer through the contact holes formed in the second and third insulating films. The conductive layer is connected to the semiconductor layer. Thus, there is provided the configuration, in which the semiconductor layer and the pixel electrodes are electrically connected to one another through the conductive layer.

To achieve the foregoing object, there is provided a second electro-optical device, which may include a substrate that has a plurality of scanning lines, a plurality of data lines, thin film transistors connected to the plurality of scanning lines and the plurality of data lines, pixel electrodes connected to the thin film transistors, semiconductor layers constituting of source regions, drain regions and first storage capacitor electrodes of the thin film transistors, an insulating thin film formed on each of the semiconductor layers, a gate electrode of each of the thin film transistors, which is formed on the insulating thin film and constituted by a part of the scanning lines, a second storage capacitor electrode of each of the storage capacitors formed on the insulating thin film, a first interlayer insulating film formed on the scanning lines and the second storage capacitor electrodes, a conductive layer formed on the first interlayer insulating film, and a second interlayer insulating film formed on the conductive layer. The data lines are formed on the second interlayer insulating film and electrically connected to the source region of the semiconductor layer through contact holes formed in the first and second interlayer insulating films.

According to the second electro-optical device of the present invention, the scanning lines, the second storage capacitor electrodes, the first interlayer insulating film, the conductive layer, the second interlayer insulating film, and the data lines are formed on the substrate in this order. The pixel electrodes are formed further above. Further, the data lines are electrically connected to the source region of the semiconductor layer through the contact holes formed in the first and second interlayer insulating films. In addition, the source and drain regions thereof are constituted by a part of the semiconductor layer. The gate insulating film of the thin film transistor is constituted by a part of the insulating film. Moreover, the gate electrode of the thin film transistor, which is formed from a part of the scanning lines, is formed on the insulating thin film. On the other hand, the first storage capacitor electrode is formed from a part of the semiconductor layer. A dielectric film of the storage capacitor is formed from a part of the insulating thin film. Furthermore, the second storage capacitor electrode constituted by a part of the storage capacitor lines is formed on the insulating film. Thus, the thin film transistors are disposed under the scanning lines. In parallel with this, the storage capacitors are placed under the second storage capacitor electrode. Therefore, with a configuration in which such storage capacitors and the thin film transistors are placed side by side, the conductive layer between the scanning lines and the data lines can be utilized for various purposes. For example, first, a part of the conductive layer is used as a third storage capacitor electrode facing the second storage capacitor electrode through the first interlayer insulating film. Namely, the first interlayer insulating film is used at this place as a dielectric film of the storage capacitor, so that the a part of the conductive layer and the second storage capacitor electrode are disposed in such a manner as to be opposed to each other. Thus, additional storage capacitance can be added to the pixel electrodes (in addition to storage capacitor obtained from the first and second storage capacitor electrodes). Alternatively, similarly as in the case of the aforementioned first electro-optical device of the present invention, the semiconductor layer can be electrically connected to the pixel electrodes through the conductive layer. Alternatively, at least a part of the opened region of the pixel can be defined with a conductive layer. Moreover, the data lines, the scanning lines, and other wirings other than the storage capacitor lines for one of the storage capacitor electrodes can be constituted by conductive layers. Further, the redundant wires of the data lines, the scanning lines, and the storage capacitor lines can be formed from conductive layers.

According to an embodiment of the second electro-optical device of the present invention, the conductive layer is electrically connected to the drain region of the semiconductor layer through the contact holes formed in the first interlayer insulating film and the insulating thin film.

In such a configuration, the data lines are electrically connected to the source region of the semiconductor layer through the contact holes formed in the insulating thin film and the first and second interlayer insulating films. The conductive layer is electrically connected to the drain region of the semiconductor layer through the contact holes formed in the first interlayer insulating film and the insulating thin film. Thus, the conductive layer can easily be used as the storage capacitor electrode connected to the pixel electrode. Simultaneously, the pixel electrodes and the drain region of the semiconductor layer can be easily and electrically connected to each other through the conductive layer.

According to another embodiment of the second electro-optical device of the present invention, the substrate may further include the third interlayer insulating film formed on the data lines. Moreover, the pixel electrodes are formed on the third interlayer insulating film, and electrically connected to the conductive layer through contact holes formed in the second and third interlayer insulating films.

In such a configuration, the pixel electrodes are formed above the data lines through the third interlayer insulating film. The pixel electrodes are electrically connected to the conductive layers via the contact holes formed in the second and third insulating films. Thus, the pixel electrodes and the drain region can be easily and electrically connected to each other through the conductive layer.

To achieve the foregoing object, according to the present invention, there is provided a third electro-optical device, which may include a plurality of pixel electrodes and a plurality of thin film transistors, which are arranged in a matrix on a substrate, scanning lines and data lines, connected to the thin film transistors via the interlayer insulating films and three-dimensionally intersecting with one another, a conductive layer, which is interposed between the semiconductor layer of the thin film transistor and the pixel electrode and electrically connected to the drain region of the semiconductor layer through a first contact hole and electrically connected to said pixel electrode through a second contact hole, a first dielectric film interposed between a first storage capacitor electrode, which is constituted by the same film as a film of a semiconductor portion constituting the drain region, and a second storage capacitor electrode disposed on said first storage capacitor electrode, and a second dielectric film interposed between the second storage capacitor electrode and a third storage capacitor electrode, which is constituted by a part of the conductive layers.

According to the third electro-optical device of the present invention, in the substrate, the plurality of scanning lines and the plurality of data lines three-dimensionally intersect with one another via the interlayer insulating film. The second storage capacitor electrodes for adding the storage capacitor to the plurality of pixel electrodes are provided therein separately therefrom. Further, the conductive layer is interposed between the semiconductor layer and the pixel electrode. On one hand, the conductive layer is electrically connected to the drain region of the semiconductor layer through the first contact hole. On the other hand, the conductive layer is electrically connected to the pixel electrode through the second contact hole. Thus, as compared with the case that only one contact hole is formed between the pixel electrode and the drain region, the diameter of contact holes can be reduced to a small value. That is, the deeper the formed contact hole, the lower the etching accuracy. Therefore, to prevent the contact hole from penetrating the thin semiconductor layer, the process of forming the hole has to be adapted so that a dry etching operation, by which the diameter of the hole can be decreased, is stopped halfway, and that finally, a wet etching operation is performed until the hole reaches the semiconductor layer. Therefore, the diameter of the contact holes has to be increased as a result of performing the non directional wet etching operation. In contrast, according to the present invention, it is sufficient to connect the pixel electrode and the drain region of the semiconductor layer by the two series-connected first and second contact holes. Thus, the contact holes can be formed by dry etching. Alternatively, at least the length of a part of each of these holes which is dug by wet etching can be decreased. Consequently, the diameter of each of the holes can be reduced to a small value. Thus, dents and uneven portions formed in the surface portion of the conductive layer are small in the first contact hole. This expedites enhancement of the flatness of this pixel electrode portions. Furthermore, dents and uneven portions formed in the surface portion of the conductive layer are small in the second contact hole. This expedites enhancement of the flatness of this pixel electrode portions. As a result, this reduces poor conditions, such as disclination of electro-optical materials, such as liquid crystals, owing to dents and uneven portions formed in the surface parts of the pixel electrodes.

Furthermore, the first dielectric film is interposed between the first storage capacitor electrode constituted by a semiconductor layer portion constituting the drain region of the semiconductor layer, and the second storage capacitor electrode placed on the first storage capacitor electrode. These three elements allow the capacitance of the first storage capacitor electrode to be imparted to the pixel electrode that is connected to the drain region of the semiconductor layer. In addition, the second dielectric film is interposed between the second storage capacitor electrode and the third storage capacitor electrode constituted by a part of the conductive layer. Hence, these three elements allow the capacitance of the second storage capacitor electrode to be imparted to the pixel electrode. Consequently, the first and second storage capacitors are formed above and under the conductive layer in such a way as to be in parallel with one another. In this manner, the three-dimensional arrangement of the storage capacitors is realized in a limited region of the substrate. Incidentally, note that each of the first and second dielectric films is constituted by a dielectric film or layer that differs from the second interlayer insulating film between the scanning lines and the data lines, which three-dimensionally intersect with one another. Thus, the thickness of the first and second dielectric films can be reduced to a technical limit, regardless of the thickness of the second interlayer insulating film required to have a certain thickness so as to suppress parasitic capacitance between the scanning lines and the data lines, which would result in occurrence of flicker and cause a voltage drop of an image signal. Assuming that the barrier layer is used as one of the storage capacitor electrodes and the interlayer insulating film between the data lines and the scanning lines is used as the dielectric film in the aforementioned prior art device, in which this barrier layer (corresponding to the conductive layer of the present invention) is formed from the same conductive layer as constituting the data lines, this dielectric film should have a thickness of about 800 nm so as to eliminate the influence of the parasitic capacitance between the data lines and the scanning lines. Thus, it is essentially difficult to construct the storage capacitor of large capacitance by using the barrier layer. In contrast with this, the present invention can extremely efficiently increase the capacitance of the storage capacitors, which is inversely proportional to the thickness of a dielectric film, by using the dielectric film which can be formed in such a way as to have a small thickness.

Furthermore, according to the present invention, the diameter of the first contact hole can be decreased still more by forming the dielectric film in such a manner as to be small in thickness. The depth of the dents and the degree of the flatness of the uneven parts formed on the conductive layer can be reduced to a smaller value in the aforementioned first contact hole. This expedites the increase in the degree of the flatness of the surfaces of the pixel electrodes disposed above the conductive layer. Consequently, the poor conditions of the electro-optical material which are due to the dents and the uneven potions formed in the pixel electrodes are alleviated. Finally, this realizes an image display whose picture quality is enhanced still more.

Incidentally, in the case that the conductive layer and the second dielectric film are formed by attaching importance to the light shielding function of the conductive layer and the layout of the contact holes in place of or in addition to the storage capacitor adding function in this device of the present invention in such a way as to reach the scanning lines, it is sufficient to form the second dielectric film in such a manner as to be thick to the extent that the parasitic capacitance between the conductive layer and the scanning line is negligible. Therefore, in such a cases it is difficult to increase the capacitance of the storage capacitors when the thickness of the second dielectric film is reduced to the technical limit as described above. However, when sufficient storage capacitor is added to the device in view of the specifications of the device, there is no necessity for reducing the thickness of the second dielectric film further. It is advantageous for the entire electro-optical device to be constructed in such a manner as to expedite enhancement of the additional functions, such as the light shielding function of the conductive layer. In short, in view of the practical individual specifications of the device, it is sufficient to set the planar layout of the conductive layer and the thickness of the second dielectric layer so that the conductive layer fully achieve the essential functions, such as the relaying function and the function of adding the necessary storage capacitance, and the additional functions, such as the light shielding function.

According to an embodiment of the third electro-optical device of the present invention, the first and second storage capacitor electrodes at least partly overlap with each other through the first dielectric film in a planar view. Further, the second and third storage capacitor electrodes at least partly overlap with each other through the second dielectric film in a planar view.

With such a configuration, the first and third storage capacitor electrodes are respectively formed above and under the second storage capacitor electrode. Thus, the three-dimensional arrangement of the storage capacitor electrodes is realized on such a limited region of the substrate.

According to an embodiment of the third electro-optical device of the present invention, the first dielectric film and the insulating thin film are constituted by the same film. Further, the scanning lines and the second storage capacitor electrode are constituted by the same film. Moreover, the second interlayer insulating film is formed on the scanning lines and the conductive layer.

With this configuration, the first dielectric film and the insulating film of the thin film transistor are constituted by the same film, so that these insulating films can be formed in the same process. The scanning lines and the second storage capacitor electrode are constituted by the same film, so that these conductive films can be formed in the same process. Further, the second interlayer insulating film is formed on the scanning lines and the conductive layer. Moreover, the data lines are formed thereon. Therefore, the storage capacitance can be increased by forming the first and second dielectric films in such a manner as to have a small thickness. Simultaneously with this, the parasitic capacitance between the scanning lines and the data lines can be decreased by forming the second interlayer insulating film in such a way as to be relatively large in thickness. Consequently, a high-picture quality image display can be realized by using such a relatively simple configuration.

According to another embodiment of the third electro-optical device of the present invention, the first and second interlayer insulating films are constituted by the same film.

With this configuration, the first and second interlayer insulating films can be formed in the same process. It is advantageous to the device in that the number of steps of the manufacturing process is not increased.

According to another embodiment of the first, second or third electro-optical device of the present invention, the conductive layer is constituted by a conductive light shielding film.

With this configuration, the aperture region of each of the pixels can be defined at least partly by the conductive layer that is constituted by the conductive light shielding film. Such a configuration, in which a part of or all of a built-in light shielding film (that is, a conductive layer constituted by a light shielding film) is provided on the substrate (normally TFT array substrate) in place of a light shielding film formed on the other substrate (usually, the opposing substrate), is extremely advantageous in that the positional deviation between a substrate and an opposing substrate in the manufacturing process does not deteriorate the pixel aperture ratio.

In the case of this embodiment, in which the conductive layer is constituted by the light shielding film, it is preferable that the conductive layer be formed so that the projections of the conductive layer on the substrate extends between adjoining data lines along the scanning lines and in an island corresponding to each of the pixel electrodes.

With this configuration, in which the conductive layer is formed in island, the influence of stress of the film constituting the conductive layer can be reduced. Moreover, part or all of a side which extends along the scanning lines of the pixel aperture region can be defined by the conductive layer. Especially, in the case that the influence of the parasitic capacitance between the scanning line and the conductive layer cannot be neglected from the viewpoint of the practical design of the circuit of the device, it is preferable that the side which extends along the scanning lines of the pixel aperture region at the side, at which the storage capacitor lines adjoin the pixel electrodes, is defined by the conductive layer without providing the conductive layer on the scanning lines.

In the case of this embodiment, in which the island-like light shielding film is provided as the conductive layer, the adjoining data lines and the conductive layer may be formed so that these lines and the layer at least partly overlap with each other in a planar view.

With this configuration, there is no gap through which light penetrates between the end portion of the island-like conductive layer and the edge of each of the data lines. That is, the edge portions of the data lines coincide with or slightly overlap with the end portion of the conductive layer. Thus, this embodiment can prevent an occurrence of a poor-quality display, such as light leakage, in this portion.

In the case of this embodiment, in which the aforementioned conductive layer is constituted by the light shielding film, the conductive layer and the scanning lines overlap with each other in a planar view.

With this configuration, the side, which extends along the scanning lines, of the pixel aperture region may be defined by the conductive layer constituted by the light shielding film that is adapted to at least partly cover both the groups of the scanning lines and the storage capacitor lines.

In the case of the embodiment, in which the aforementioned conductive layer is constituted by the light shielding film, the conductive layer may contain high-melting-point metal.

With this configuration, the conductive layer can be prevented from being broken or melted by a high temperature treatment to be performed after the conductive layer constituted by the light shielding film is formed. For example, the light shielding film is constituted by a metallic simple substance, an alloys or a metallic silicide, which contains at least one of Ti, Cr (chrome), W (tungsten), Ta (tantalum), Mo (molybdenum), and Pb (lead) that are opaque high-melting-point metals.

In the case of another embodiment of the first, second, or third electro-optical device of the present invention, the conductive layer is constituted by an electrically conductive polysilicon film.

With this configuration, the conductive layer constituted by the conductive polysilicon film can fully achieve the storage-capacitance increasing function and the relaying function, though this layer does not fully serve as a light shielding film. In this case, especially, stress due to heat or the like hardly occurs between this film and the interlayer insulating film. Thus, this device is advantageous in that the generation of cracks in and around the conductive layer is avoided.

In the case of another embodiment of the first, second, or third electro-optical device of the present invention, the conductive layer is constituted by a laminated layer film consisting of two or more layers made of conductive polysilicon film and high-melting-point metal.

With this configuration, the conductive layer constituted by the conductive polysilicon film can fully achieve the storage-capacitance increasing function and the relaying function, though this layer does not fully serve as the light shielding film. Further, when the semiconductor layer is electrically connected to the conductive polysilicon film, if the semiconductor layer is formed from the same polysilicon film, the contact resistance can be considerably lowered. Moreover, if a high-melting-point metal layer is stacked on such a conductive polysilicon film, the conductive layer fully serves as the light shielding film. Furthermore, the resistance thereof can be lowered.

In the case of another embodiment of the first, second, or third electro-optical device of the present invention, the substrate further has a light shielding film provided in an area at which the light shielding film covers the channel region of said semiconductor layer in a planar view.

With this configuration, the light shielding film provided at a side which is nearer to the substrate than the thin film transistor that is, provided under the thin film transistor, can prevent return light from entering the channel region and LDD (lightly doped drain) region of the thin film transistor, and can prevent the characteristics of the thin film transistor from being changed and deteriorated by the generation of a photoelectric current. Moreover, all or part of the pixel aperture region can be defined by this light shielding film.

In the case of the embodiment having this light shielding film, the light shielding film may extend under the scanning lines and may be connected to a constant potential source.

With this configuration, the characteristics of the thin film transistor provided above the light shielding film via an underlying insulating film are prevented from being changed and deteriorated due to variation in the electric potential of the light shielding film.

Alternatively, in the case of the embodiment including this light shielding film, the light shielding film may be electrically connected to the second storage capacitor electrode through a contact hole formed in an underlying insulating film interposed between the light shielding film and the semiconductor layer.

With this configuration, the electric potential at the second storage capacitor electrode can be made to be equal to that at the light shielding film. If the electric potential at one of the second storage capacitor electrode and the light shielding film is set at a predetermined value, the electric potential at the other of the second storage capacitor electrode and the light shielding film can be set at the predetermined value. At that time, if the light shielding film is a storage capacitor line, the second storage capacitor electrode is connected to the capacitor line, so that constant electric potential can be applied to said second storage capacitor electrode. Consequently, the negative influence of electric potential fluctuation at the second storage capacitor electrode and the light shielding film can be reduced.

According to another embodiment of the third electro-optical device of the present invention, the second storage capacitor electrode is extended and serves as the capacitor line.

With this configuration, the electric potential at the capacitor line can be maintained at a constant level. Thus, the electric potential at the second storage capacitor electrode can be stabilized. Further, at that time, the capacitor lines and the scanning lines can be formed from the same film.

According to another embodiment of the third electro-optical device of the present invention, the capacitor line is electrically connected to the light shielding film through the underlying insulating film.

With this configuration, the electric potential at the capacitor lines can be made to be equal to that at the light shielding film. If the electric potential at one of the capacitor lines and the light shielding film is set at a predetermined value, the electric potential at the other of the capacitor lines and the light shielding film can be set at the predetermined value. Consequently, the negative influence of electric potential fluctuation at the capacitor lines and the light shielding film can be reduced. Further, the wire constituted by the light shielding film and the capacitor lines can be mutually made to serve as redundant wires.

According to another embodiment of the third electro-optical device of the present invention, the conductive layer and the light shielding film may be disposed so that the conductive layer at least partly overlaps with the light shielding film in a planar view.

With this configuration, the conductive layer and the light shielding film are formed in such a way as to sandwich the channel region of the semiconductor layer therebetween. Thus, light can be prevented from entering the channel region from the substrate side thereof and the other side. Consequently, the characteristics of the thin film transistors can be prevented from being changed and deteriorated. Moreover, this can prevent an occurrence of a crosstalk, a reduction in the contrast ratio, and deterioration in a flicker level.

According to another embodiment of the first, second, or third electro-optical device of the present invention, the underlying insulating film is provided between the substrate and each of the thin film transistors. Moreover, the third interlayer insulating film is provided on the data lines and under the pixel electrodes. At least one of the substrate, the underlying insulating film, the second interlayer insulating film, and the third interlayer insulating film is formed in such a way as to be partly dented in at least one of regions respectively corresponding to the thin film transistors, the scanning lines, the data lines, and the storage capacitors. Thus, the foundation surface of the pixel electrodes is formed in such a manner as to be almost flat.

With this configuration, at least one of the substrate and a plurality of interlayer insulating films is formed in such a way as to be partly dented in at least one of regions corresponding to the thin film transistors, the scanning lines, the data lines, and the storage capacitors. Thus, the difference between regions, in which the thin film transistors, the scanning lines, and the storage capacitors are formed in such a way as to overlap with the data lines, and other regions can be reduced. In this way, the bottom surfaces of the pixel electrodes are made to be almost flat. Consequently, the degree of the flatness of the surface of each of the pixel electrodes can be increased still more. Thus, this reduces poor conditions, such as disclination, of electro-optical materials, such as liquid crystals, owing to dents and uneven portions formed in the surface parts of the pixel electrodes. Finally, a high-picture-quality image display can be achieved.

According to another embodiment of the third electro-optical device of the present invention, the first contact hole and the second contact hole are formed at different places on the surface of the substrate.

Small dents and uneven portions are formed in the conductive layer corresponding to the place on the surface thereof, in which the first contact hole is formed. Thus, when the second contact hole is further formed just above this place, it is difficult to provide favorable electrical connection therebetween. Therefore, if the positions on the surface respectively corresponding to these holes are slightly differed from each other, it is expected that the favorable electric connection therebetween is provided.

According to another embodiment of the first, second, or third electro-optical device of the present invention, the thickness of the conductive layer ranges from 50 nm to 500 nm.

With this configuration, there is almost or entirely no negative effect (for instance, poor alignment of the liquid crystals) due to the difference in height between the surfaces of the pixel electrodes, which is caused by the presence of the conductive layer, because the thickness of the conductive layer ranges from 50 nm to 500 nm. Or else, the negative influence of such difference therebetween can be eliminated by flattening or leveling the interlayer insulating film placed above the conductive layer. Further, various advantageous effects can be obtained by alleviating the negative influence of the conductive layer.

According to another embodiment of the second electro-optical device of the present invention, the thickness of the first interlayer insulating film ranges from 10 nm to 200 nm.

With this configuration, the first interlayer insulating film is formed as a relatively thin insulating film, because the thickness thereof ranges from 10 nm to 200 nm. Therefore, if an additional storage capacitor is constructed, as described above, by utilizing this first interlayer insulating film as the dielectric film so that the first and second storage capacitor electrodes and the conductive layer are placed in such a way as to be opposed to each other through the first interlayer insulating film, the storage capacitor having large capacitance can be obtained according to the thickness thereof.

According to anther embodiment of the third electro-optical device of the present invention, the thickness of the second dielectric film ranges from 10 nm to 200 nm.

With this configuration, the second dielectric film is a relatively thin insulating film because the thickness of the second dielectric film ranges from 10 nm to 200 nm. Thus, the storage capacitor obtained by placing the second and third storage capacitor electrodes in such a manner as to be opposed to each other through the second dielectric film is large according to the thickness thereof.

According to an embodiment in which the conductive layer is constituted by the light shielding film, the conductive layer may be formed in such a fashion as to define at least a part of the pixel aperture region.

With this configuration, the pixel aperture region can be defined by the conductive layer singly, or together with the data lines and the light shielding film formed on the other substrate. Especially, if the aperture region is defined without forming the light shielding film on the other substrate, the number of steps of the manufacturing process can be decreased. Moreover, a decrease or variation in the pixel aperture ratio, which would be caused by alignment deviation between a pair of the substrates, can be prevented. This is advantageous for the electro-optical device.

To achieve the foregoing object, according to the present invention, there is provided a method for manufacturing an electro-optical device, which has a plurality of scanning lines, a plurality of data lines, thin film transistors placed correspondingly to intersections between the scanning lines and the data lines, and pixel electrodes and storage capacitors connected to the thin film transistors. This method may include the steps of forming a source region, a channel region, and a drain region of each of the thin film transistors, a semiconductor layer constituting a first storage capacitor electrode corresponding to one of the storage capacitors on a substrate, forming an insulating thin film on the semiconductor layer, forming the scanning lines and a second storage capacitor electrode of one of the storage capacitors on the insulating thin film, forming a first interlayer insulating film on the second storage capacitor electrode, forming a first contact hole in the gate insulating film and the first interlayer insulating film, forming a conductive layer on the first interlayer insulating film so that the conductive layer is electrically connected to the semiconductor layer through the first contact hole, forming a second interlayer insulating film on the conductive layer, forming the data lines on the second interlayer insulating film, forming a third interlayer insulating film on the data lines, forming a second contact hole in the second and third interlayer insulating film, and forming the pixel electrodes in such a manner as to be electrically connected to the conductive layer through the second contact hole.

According to the method for manufacturing an electro-optical device of the present invention, the electro-optical device can be manufactured by performing a relatively simple process.

An embodiment of the method for manufacturing an electro-optical device of the present invention may further include the steps of: forming a light shielding film in a region facing the channel region of the substrate, and forming an underlying insulating film on the light shielding film. In the step of forming the semiconductor layer, the semiconductor layer is formed on the substrate insulating film.

With such constitution, an electro-optical device, in which the light shielding film is provided under the thin film transistors, can be manufactured by performing a process consisting of a relatively small number of steps, each of which are relatively simply achieved.

An embodiment of the method for manufacturing an electro-optical device of the present invention may further include the step of making at least one of the substrate, the underlying insulating film, the second interlayer insulating film, and the third interlayer insulating film to be dented in a part of at least one of regions respectively corresponding to the thin film transistors, the scanning lines, the data lines, and the storage capacitors.

According to such an embodiment, the bottom surface of each of the pixel electrodes can be flattened by forming making at least one of the substrate, the underlying insulating film, the second interlayer insulating film, and the third interlayer insulating film to be dented in a part of at least one of regions respectively corresponding to the thin film transistors, the scanning lines, the data lines, and the storage capacitors. Thus, poor conditions, such as disclination, can be alleviated. Such effects and other advantages will become apparent from the following description of embodiments of the present invention.

BRIEF DESCRIPTION OF THE DRAWINGS

FIG. 5 is a diagram illustrating (Part 2 of) the manufacturing process of the liquid crystal device, in the first embodiment, step by step;

FIG. 6 is a diagram illustrating (Part 3 of) the manufacturing process of the liquid crystal device, in the first embodiment, step by step;

FIG. 7 is a diagram illustrating (Part 4 of) the manufacturing process of the liquid crystal device, in the first embodiment, step by step;

DETAILED DESCRIPTION OF THE EXEMPLARY EMBODIMENTS

Figure 1:
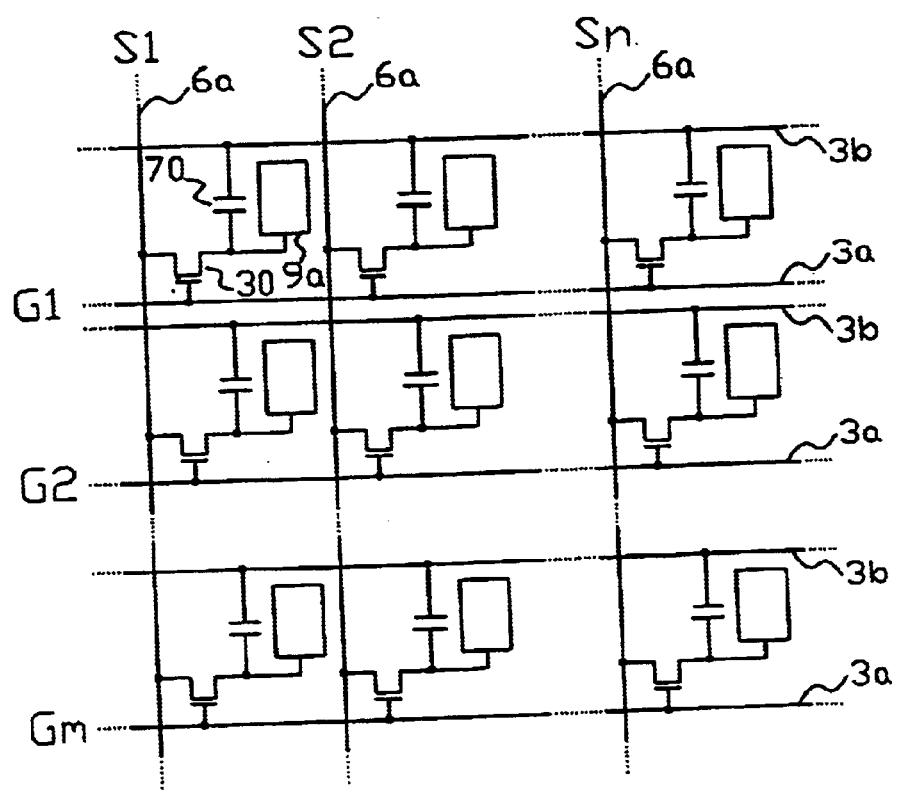
FIG. 1 is a diagram illustrating an equivalent circuit containing a variety of elements provided in a plurality of pixels arranged in a matrix and wirings of an image display region in a liquid crystal device, in a first embodiment of an electro-optical device of the present invention.
Figure 2:
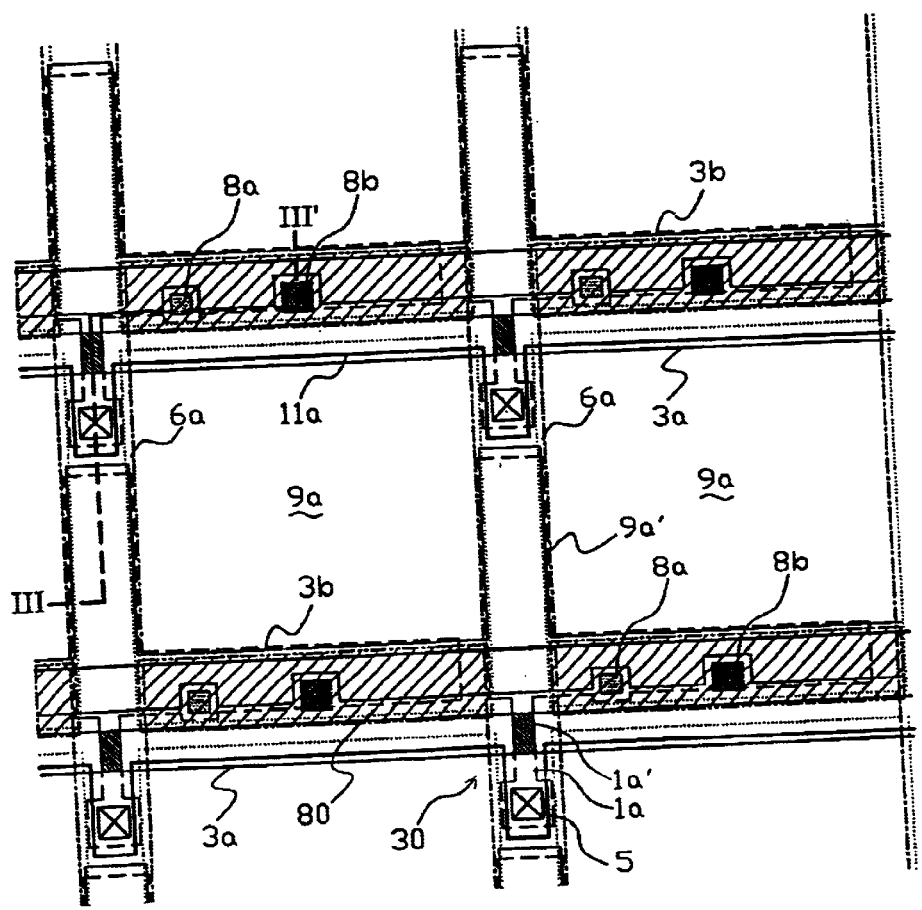
FIG. 2 is a plan diagram illustrating the plurality of adjacent pixels arranged on a TFT array substrate, on which data lines, scanning lines, pixel electrodes, and a light shielding film are formed, in the liquid crystal device in the first embodiment of the present invention.
Figure 3:
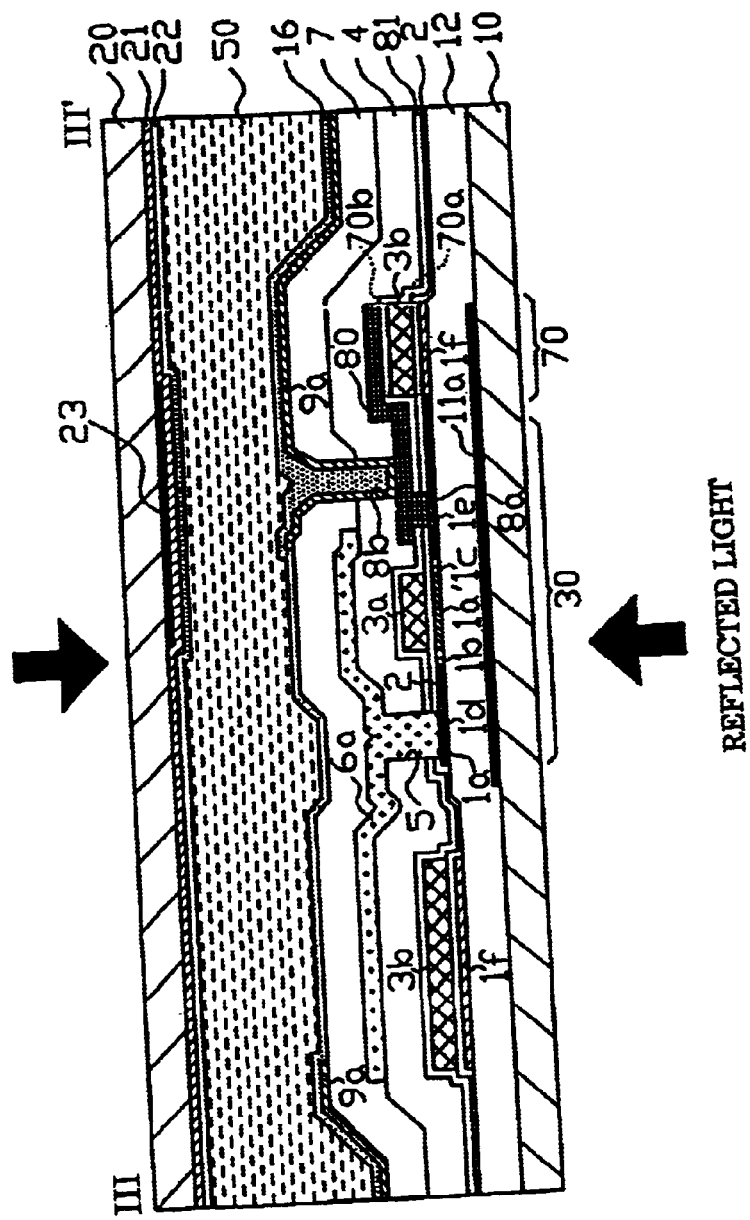
FIG. 3 is a sectional view taken on line III—III' of FIG. 2.

Hereinafter, embodiments of the present invention will be described with reference to the accompanying drawings.
First Embodiment of Electro-Optical Device The configuration of a liquid crystal device in a first embodiment of an electro-optical device of the present invention, will be described by referring to FIGS. 1 to 3. FIG. 1 is a diagram illustrating an equivalent circuit of a circuit containing a variety of elements in a plurality of pixels arranged in a matrix-like manner and wirings of an image display region in the liquid crystal device. FIG. 2 is a plan diagram illustrating the plurality of adjacent pixels arranged on a TFT array substrate, on which data lines, scanning lines, pixel electrodes, and a light shielding film are formed, in the liquid crystal device in the first embodiment of the present invention. FIG. 3 is a sectional view taken on line III—III' of FIG. 2. Incidentally, in FIG. 3, a scale factor is allowed to vary with layers and members so that such layers and members are recognizable in this figure.

As shown in FIG. 1, a plurality of TFTs 30 for controlling pixel electrodes 9a are formed in such a way as to be placed in a matrix respectively corresponding to a plurality of pixels formed in such a fashion as to be disposed in a matrix in an image display region of the liquid crystal device of this embodiment. Further, data lines 6a, through which image signals are supplied, are electrically connected to the sources of the TFTs 30. The pixel electrodes 9a and the TFTs 30 are disposed correspondingly to the intersections between scanning lines 3a and the data lines 6a. Image signals S1, S2, ..., and Sn to be written may be supplied in a line sequential manner to the data lines 6a in this order. Alternatively, groups of such image signals may be supplied to the plurality of adjoining data lines 6a group by group. Furthermore, the scanning lines 3a are electrically connected to the gates of the TFTs 30. Scanning signals G1, G2, ..., and Gm are applied with predetermined timing as pulses to the scanning lines 3a in this order in a line sequential manner. The pixel electrodes 9a are electrically connected to the drains of the TFTs 30 and then used to write the image signals S1, S2, ..., and Sn supplied from the data lines 6a to liquid crystals with predetermined timing by closing the TFTs 30 serving as switching devices, for a certain period. The image signals S1, S2, ..., and Sn of predetermined levels being written to the liquid crystals through the pixel electrodes 9a are held for a certain period between opposing electrodes (to be described later) formed on an opposing substrate (to be described later). The alignment and order parameter of liquid crystal molecules changes according to the level of a voltage to be applied thereto. This modulates light and allows gray-scale display. In a normally white mode, this liquid crystal portion is prevented from transmitting incident light according to the voltage applied thereto. Conversely, in a normally black mode, this liquid crystal portion is permitted to transmit the incident light according to the voltage applied thereto. Thus, light representing a displayed image having the contrast determined according to the image signals is outputted from the liquid crystal device as a whole. Incidentally a storage capacitor 70 is added to the device in parallel with a liquid capacitor formed between the pixel electrode 9a and the opposing electrode so as to prevent the held image signals from leaking. The voltage applied to the pixel electrode 9a is maintained by the storage capacitor 70 for a time three digits longer than a time period during which a source voltage is applied thereto. This improves the holding characteristics of the device and realizes a liquid crystal device that achieves a high contrast display.

As shown in FIG. 2, a plurality of transparent pixel electrodes 9a (whose contours are indicated by dotted lines 9a') are provided in a matrix on the TFT array substrate of the liquid crystal device. Moreover, the data lines 6a, the scanning lines 3a, and the storage capacitor lines 3b are provided along the lengthwise and breadthwise boundaries of the pixel electrodes 9a. The data lines 6a are electrically connected through the contact hole 5 to the source regions (to be described later) of the semiconductor layer 1a constituted by a polysilicon film or the like. The pixel electrodes 9a are formed in regions hatched with oblique lines extending in the direction from the lower left corner to the upper right corner thereof in this figure. Further, the pixel electrodes 9a are electrically connected to the drain regions (to be described later) of the semiconductor layers 1a through the first contact holes 8a and the second contact holes 8b via the conductive layers (hereinafter referred to as "barrier layers") 80 serving as buffers. Furthermore, the scanning lines 3a are arranged in such a manner as to face the channel regions 1a' (hatched with oblique lines extending in the direction from the upper left corner to the lower right corner thereof in this figure) of the semiconductor layer 1a. The scanning lines 3a serve as gate electrodes. In this way, the TFTs 30 are provided at the intersections of the scanning lines 3a and the data lines 6a so that the scanning lines 3a are disposed as the gate electrodes in such a way as to face the channel regions 1a'.

The storage capacitor lines 3b each have a main line portion extending along the scanning line 3a almost linearly, and a protruded portion protruding from an intersection of the data line 6a and the protruded portion to a front stage side (upwardly, as viewed in this figure) along the data line 6a.

Further, first light shielding films 11a are provided in the regions indicated by thick lines in this figure, under the scanning lines 3a, the storage capacitor lines 3b, and the TFTs 30. More specifically, as shown in FIG. 2, the first light shielding films 11a are formed in stripes along the scanning lines 3a. Moreover, a large-width intersection part of each of the films 11a which intersect with the data lines 6a is formed in a portion shown in a lower part of this figure. The films 11a are disposed at places at which the large-width parts cover the channel regions 1a' when viewed from the TFT array substrate side.

Next, as shown in the sectional diagram of FIG. 3, the liquid crystal device has a TFT array substrate 10 and an opposing substrate 20 that is an example of another transparent substrate to be placed in such a manner as to be opposed to the substrate 10. The TFT array substrate 10 is constituted by, for instance, a quartz substrate. The opposing substrate 20 is constituted by, for example, a glass substrate or a quartz substrate. The pixel electrodes 9a are provided on the TFT array substrate 10. An alignment film 16 having undergone a predetermined alignment treatment, such as a rubbing treatment, is provided on the pixel electrodes 9a. The pixel electrodes 9a are constituted by, for instance, transparent conductive thin films, such as an ITO film. Further, the alignment film 16 is constituted by, for example, an organic thin film, such as a polyimide thin film.

On the other hand, opposing electrodes 21 are provided on the entire surface of the opposing substrate 20. An alignment film 22 having undergone the predetermined alignment treatment, such as the rubbing treatment, is provided under the opposing electrodes 21. The opposing electrodes 21 are constituted by, for instance, a transparent conductive thin film, such as an ITO film. Further, the alignment film 22 is constituted by, for example, an organic thin film, such as a polyimide thin film.

Pixel switching TFTs 30 for switching and controlling the pixel electrodes 9a are provided at places on the TFT array substrate 10 which adjoin the pixel electrodes 9a.

Further, as illustrated in FIG. 3, a second light shielding film 23 may be provided in a non-open region of each of the pixels on the opposing substrate 20. Thus, incident light does not enter the channel regions 1a', the low concentration source region 1b, and the low concentration drain region 1c of the semiconductor layer 1a of each of the pixel switching TFTs 30 from the side of the opposing substrate 20. Moreover, the second light shielding film 23 has the functions of improving the contrast of a displayed image, and preventing an occurrence of a mixed color in the case of forming a color filter.

Liquid crystals, which are an example of the electro-optical material, is sealed in a space defined by the sealing material (to be described later) between TFT array substrate 10 and the opposing substrate 20 constructed as described above and placed so that the pixel electrodes 9a face the opposing electrodes 21. Thus, a liquid crystal layer 50 is formed. The liquid crystal layer 50 takes a predetermined alignment state according to the alignment films 16 and 22 when no electric field is applied from the pixel electrodes 9a thereto. The liquid crystal layer 50 consists of liquid crystals obtained by mixing one or more kinds of nematic liquid crystals. The sealing material is an adhesive agent including, for instance, a photo-curing resin or a thermosetting resin, for bonding together the TFT array substrate 10 and the opposing substrate 20 in the peripheral portions thereof. Further, gap materials, such as glass fibers and glass beads, for adjusting the distance between the substrates to a predetermined value are mixed into the sealing material.

Further, as illustrated in FIG. 3, a first light shielding film 11a is provided at a position facing each of the pixel switching TFTs 30 between the TFT array substrate 10 and each of the pixel switching TFTs 30. Preferably, the first light shielding film 11a is constituted by a metallic substance, an alloy, or a metallic silicide, which contains at least one of Ti, Cr, W, Ta, Mo, and Pb, which are opaque high-melting-point metals. In the case that the first light shielding film 11a is constituted by such a material, the first light shielding film 11a can be prevented from being damaged and melted by a high temperature treatment in the process of forming the pixel switching TFTs 30 to be performed upon completion of the step of forming the first light shielding film 11a on the TFT array substrate 10. As a result of forming such a light shielding film 11a, reflected light (or return light) from the side of the TFT array substrate 10 is prevented from entering the channel region 1a', the low concentration source region 1b, and the low concentration drain region 1c of each of the pixel switching TFTs 30, which are apt to be optically excited. Further, the characteristics of the pixel switching TFTs 30 are prevented from being changed and deteriorated owing to an occurrence of a photo-current due to this excitation.

Furthermore, an underlying insulating film 12 is provided between the first light shielding film 11a and each of the plurality of pixel switching TFTs 30. The underlying insulating film 12 is provided for electrically insulating the semiconductor layer 1a of each of the pixel switching TFTs 30 from the first light shielding film 11a. Furthermore, the underlying insulating film 12 is formed on the entire surface of the TFT array substrate 10 and serves as an underlying film or coat for the pixel switching TFTs 30. Namely, the film 12 has the function of preventing the characteristics of the pixel switching TFTs 30 from being deteriorated owing to the roughness caused at the time of polishing the surface of the TFT array substrate 10 and the stain left thereon after washed. The underlying insulating film 12 is constituted by, for example, highly insulative glass, such as NSG (non-doped silicate glass), PSG (phosphorus silicate glass), BSG (boron silicate glass), BPSG (boron-phosphosilicate glass), or silicon oxide film, or silicon nitride film. The underlying insulating film 12 can prevent the pixel switching TFTs 30 from being stained by the first light shielding film 11a.

In this embodiment, the semiconductor layer 1a is extended from a high concentration drain region 1e and used as the first storage capacitor electrode 1f. A part of the storage capacitor line 3b opposing this is used as the second storage capacitor electrode. An insulating thin film 2 is extended from a position opposite the scanning line 3a, and is used as a first dielectric film sandwiched between these electrodes. The first storage capacitor 70a is constructed in this manner. Furthermore, a part of the barrier layer 80 facing the second storage capacitor electrode is used as a third storage capacitor electrode. A first interlayer insulating film 81 is provided between these electrodes. The first interlayer insulating film 81 also serves as a second dielectric film. The second storage capacitor 70b is formed on the first interlayer insulating film 81. Further, the first storage capacitor 70a and the second storage capacitor 70b are connected in parallel thereto through the first contact hole 8a. The storage capacitor 70 is constructed in this manner.

More particularly, the high concentration drain region 1e of the semiconductor layer 1a is extended under the data lines 6a and the scanning lines 3a so that the pixel switching TFTs 30 are formed. Similarly, a first storage capacitor electrode If is formed and placed in such a way as to face the capacitor line 3b extending along the data lines 6a and the scanning line 3a through the first dielectric film 2. Especially, the first dielectric film 2 is an insulating thin film 2 of the TFT 30 formed on the polysilicon film by high-temperature oxidation. Thus, the film 2 can be formed in such a manner as to be as a thin high-withstand-voltage insulating film. The first storage capacitor 70a can be formed as a storage capacitor having relatively large capacitance, whose surface has a relatively small area. Furthermore, the second dielectric film 81 can be formed as a thin film, similarly as the insulating thin film 2. Thus, as illustrated in FIG. 2, the second storage capacitor 70b can be constructed as a storage capacitor which has a relatively small area and large capacitance, by utilizing a region between the adjoining data lines 6a. Therefore, the storage capacitor 70 constructed three-dimensionally from the first storage capacitor 70a and the second storage capacitor 70b can be formed in such a manner as to have a small area and large capacitance, by effectively utilizing a region, in which disclination occurs in liquid crystals (namely, the region where the capacitor line 3b is formed) provided under the data lines 6a and along the scanning lines 3a, and utilizing a space which is way off the pixel aperture region.

As shown in FIG. 3, each of the pixel switching TFTs 30 has an LDD structure and includes the scanning lines 3a, the channel region 1a' in which a channel is formed by an electric field generated from the scanning lines 3a of the semiconductor layer 1a, the insulating thin film 2 for insulating the scanning lines 3a and the semiconductor layer 1a, the data lines 6a, the low concentration source region 1b, and the low concentration drain region 1c, the high concentration source region 1d, and the high concentration drain region 1e of the semiconductor layer 1a. Further, the high concentration drain region 1e is connected to a corresponding one of the plurality of pixel electrodes 9a via the barrier layer 80. The low concentration source region 1b, the high concentration source region 1d, the low concentration drain region 1c, and the high concentration drain region 1e are formed by doping n-type or p-type impurities having predetermined concentrations into the semiconductor layer 1a according to whether an n-channel or p-channel is formed. N-channel TFTs are advantageous in that the operating speed thereof is high, and thus often used as the pixel switching TFTs 30, which are switching elements for switching the pixels. In this embodiment, especially, each of the data lines 6a is constituted by a light-shielding conductive thin film, for instance, a low-resistance metal film, such as an Al film, or a metal alloy, such as a metallic silicide. Moreover, a contact hole 5 guided to the high concentration source region 1d, and the contact hole 8b guided to the barrier layer 80 are formed above the barrier layer 80 and the second dielectric film (namely, the first interlayer insulating film) 81. The data line 6a is electrically connected to the high concentration source region 1d through the contact hole 5 guided to this high concentration source region 1d. Further, a third interlayer insulating film 7 having the contact hole 8b formed in such a manner as to be guided to the-barrier layer 80 is formed on the data lines 6a and a second interlayer insulating film 4. The pixel electrodes 9a electrically connected to the barrier layer 80 are also electrically connected to the high concentration drain region 1e through the contact hole 8a via the barrier layer 80. The aforementioned pixel electrodes 9a are provided on the top surface of the third interlayer insulating film 7 constructed in this manner.

Preferably, each of the pixel switching TFTs 30 has the LDD structure, as described above. However, each of the TFTs 30 may have an offset structure in which implantation of impurities into the low concentration source region 1b and the low concentration region 1c is not performed. Alternatively, the TFTs 30 may be of the self-alignment type in which the implantation of the impurities of high concentrations thereinto is performed by using the gate electrode, namely, a part of the scanning line 3a as a mask and the high concentration source and drain regions are formed in a self-alignment manner.

Further, this embodiment employs a single gate structure in which only one gate electrode, namely, a part of the scanning line 3a is placed between the high concentration source region 1d and the high concentration drain region 1e. However, two or more gate electrodes may be provided therebetween. At that time, the same signal is applied to each of the gate electrodes. Thus, when the TFTs are constructed by employing a dual gate structure, or a structure having triple or more gate electrodes, an occurrence of a leakage current in a junction portion among the channel and the source-drain regions can be prevented. A current flowing when turned off can be reduced. If at least one of the gate electrodes has the LDD structure or the offset structure, an off-current can be decreased still more. Consequently, a stable switching device can be obtained.

As shown in FIGS. 2 and 3, in the liquid crystal device of this embodiment, the data lines 6a and the scanning lines 3b are formed on the TFT array substrate 10 in such a manner as to three-dimensionally intersect with one another through the second interlayer insulating film 4. Further, the barrier layer 80 is interposed between the semiconductor layer 1a and each of the pixel electrodes 9a, and electrically connects the high concentration drain region 1e and the pixel electrode 9a through the first contact hole 8a and the second contact hole 8b.

Thus, as compared with the case of forming one contact hole guided to the drain region of the semiconductor layer 1a from the pixel electrode 9a, the diameters of the first contact hole 8a and the second contact hole 8b can be decreased. That is, when one contact hole is formed, if the selection ratio at the time of etching is low, the deeper the depth of the contact hole, the more the etching accuracy is deteriorated. Thus, to prevent the contact hole from penetrating a very thin semiconductor layer 1a, which is, for example, 50 nm or so in thickness, the process of forming the hole has to be adapted so that a dry etching operation by which the diameter of the hole can be decreased is stopped halfway, and that finally, a wet etching operation is performed until the hole reaches the semiconductor layer 1a. Alternatively, there is created the necessity for providing an additional polysilicon film for preventing the contact hole from penetrating the semiconductor layer by dry etching.

In contrast, in the case of this embodiment, it is sufficient to connect the pixel electrode 9a and the high concentration drain region 1e of the semiconductor layer by the two series-connected first and second contact holes 8a and 8b. Thus, the first contact hole 8a and the second contact hole 8b can be formed by dry etching. Alternatively, at least the length of a part dug by wet etching of each of these holes can be decreased. Incidentally, to slightly taper the first contact hole 8a and the second contact hole 8b, the wet etching may be performed for a relatively short time after the dry etching.

As described above, according to this embodiment, the diameter of each of the first contact hole 8a and the second contact hole 8b can be reduced to a small value. Thus, dents and uneven portions formed in the surface portion of the barrier layer 80 are small in the first contact hole 8a. This expedites the flattening or leveling of the pixel electrode portions 9a placed thereabove. Moreover, the dents and uneven portions formed in the surface portions of the pixel electrodes 9a are small in the second contact hole 8b. This expedites the flattening or leveling of the pixel electrode portions 9a. As a result, this reduces disclination in the liquid crystal layer 50, owing to the dents and uneven portions formed in the surface parts of the pixel electrodes 9a. Finally, this liquid crystal device can realize a high-picture-quality image display. The diameter of the second contact hole 8b which more directly affects the dents and the uneven portions on the surfaces of the aforementioned pixel electrodes 9a, can be reduced to a very small value by limiting the total thickness of the second interlayer insulating film 4 and the third interlayer insulating film 7 interposed between the barrier layer 80 and each of the pixel electrodes 9a in such a manner so as to be several hundreds nm or so Incidentally, in the case of this embodiment, the barrier layer 80 is constituted by a high-melting-point metallic film or an alloy film thereof. Thus, when the etching is performed, the selection ratios respectively corresponding to the metallic film and the interlayer insulating film largely differ from each other. Consequently, there is almost no possibility that the hole penetrates the barrier layer 80 by performing dry etching, as described above.

In the case of this embodiment, the first dielectric film 2 and the second dielectric film 81 of the storage capacitor 70 three-dimensionally constructed around the barrier layer 80 are dielectric layers provided in a layer that is different from the layer corresponding to the second interlayer insulating film 4 interposed between the data lines 6a and the scanning lines 3b, which three-dimensionally intersect with one another. Therefore, to suppress the parasitic capacitance between the data lines 6a and the scanning lines 3a causing a drop in the voltage level of the image signal, which results in flicker or the like, the barrier layer 80 is provided through a layer different from the second interlayer insulating film 4. Thus, the storage capacitance is imparted to the device. Consequently, in the case of this embodiment, the thickness of each of these first dielectric film 2 and the second dielectric film 81 can be reduced to a technical limit. As a result, especially, in the second storage capacitor 70b, the capacitance value, which is inversely proportional to the thickness of the second dielectric film 81, can be extremely efficiently increased. Especially, if a film is formed in such a manner as to be too thin, similarly as the insulating thin film 2 of the pixel switching TFT 30, no peculiar phenomena, such as a tunnel effect, occur. Therefore, in the condition that no defects such as a film breakage are produced, the second storage capacitor 70a having very large capacitance can be formed within a relatively small region by forming a film having a thickness of about 200 nm or an extremely thin film having a thickness ranging between 10 nm and 50 nm, which is less than the thickness of the insulating thin film 2. Thus, an occurrence of a flicker can be prevented. Moreover, the ability to hold a voltage can be enhanced. Consequently, a high-contrast electro-optical device can be provided.

According to experiments and studies conducted by the inventors of the present invention, assuming that, in the aforementioned prior art device, in which the barrier layer is constituted by the same conductive layer as the layer constituting the data lines 6a, this barrier layer is used as one of the storage capacitor electrodes, and the interlayer insulating film between the data line 6a and the scanning line 3a is used as the dielectric film, the dielectric film (corresponding to the second interlayer insulating film of this embodiment) is required to have a thickness of about 800 nm so as to prevent the parasitic capacitance between the data line 6a and the scanning line 3a from causing trouble. Thus, the present invention is very advantageous in that this embodiment realizes the second storage capacitor 70b, having a storage capacitance value of several times to several tens of times or more than that of the storage capacitance value of the storage capacitor of the prior art device, with respect to the same area.

Incidentally, if another laminated barrier layer or other plural laminated layers are formed between the barrier layer 80 and the pixel electrode 9a through the interlayer insulating film, the storage capacitance can be three dimensionally increased by utilizing a limited region on the TFT array substrate 10.

The second dielectric film 81 constituting the second storage capacitor 70b in this manner may be a silicon oxide film, a silicon nitride film, or a multi-layer film obtained by stacking such films. Further, the second dielectric film 81 may be formed by various kinds of known techniques (for instance, a low-pressure CVD method, an atmospheric-pressure CVD method, a plasma CVD method, a thermal oxidation method, a sputtering method, an ECR plasma CVD method, and a remote plasma enhanced CVD method) to be usually used for forming the insulating thin film 2. Additionally, in the case that the barrier layer 80 and the second dielectric film 81 are formed by attaching importance to the light shielding function of the barrier layer 80, which is constituted by a light shielding film, and the layout of the first contact hole 8a and the second contact hole 8b in place of or in addition to the storage capacitance adding function of the barrier layer 80 in such a way as to reach the scanning lines 3a, it is preferable to form the second dielectric film 81 in such a manner as to be thick to the extent that the parasitic capacitance between the barrier layer 80 and the scanning line 3a is negligible.

On the other hand, it is preferable that the thickness of the barrier layer 80 is, for example, 50 nm to 500 nm or so. If the thickness of the barrier layer 80 is 50 nm or so, the possibility of penetration of the second contact hole 8b through the barrier layer 80 in the manufacturing process is low. Further, if the thickness of the layer 80 is 500 nm or so, the unevenness of the surfaces of the pixel electrodes 9a is negligible, or the surfaces thereof can be relatively easily flatten.

Furthermore, in the case of this embodiment, the diameter of the first contact hole 8a can be reduced still more, as a result of forming the first interlayer insulating film (namely, the second dielectric film) 81. The dents and uneven portions of the barrier layer 80 in the first contact hole 8a are smaller. The flattening or leveling of the surface of the pixel electrode 9a disposed thereabove is expedited still more. Thus, the disclination of the liquid crystal due to the dents and uneven portions in the pixel electrode 9a is reduced. Finally, an image display of higher picture quality is realized.

Incidentally, even in the case of the configuration of the liquid crystal device of this embodiment, the second interlayer insulating film 4 interposed between the scanning line 3b and the data line 6a is required to have a thickness (for example, 800 nm or so), at which the parasitic capacitance between both these wires is negligible, similar to that of the prior art device.

In this embodiment constituted as described above, especially, the first light shielding film 11a formed in a stripe may be extended under the scanning line 3a and electrically connected to an constant potential source or a large capacitance portion. With this constitution, a change in electric potential at the first light shielding film 11a does not exert a negative influence on the pixel switching TFT 30 placed in such a manner so as to face the film 11a. In this case, constant potential sources, such as a negative power supply and a positive power supply, for supplying electric power to peripheral circuits (for instance, a scanning-line driving circuit and a data-line driving circuit) adapted to drive the liquid crystal device, a grounded power supply, and a constant potential source for supplying electric power to the opposing electrode 21 are cited as the constant potential source.

Further, the storage capacitor lines 3b and the scanning lines 3a are constituted by the same polysilicon film. The first dielectric film 2 of the first storage capacitor 70a and the insulating thin film 2 of the pixel switching TFTs 30 are constituted by the same high-temperature oxide film. The first storage capacitor electrode 1f and the channel region 1a′, the low concentration source region 1b, the low concentration drain region 1c, the high concentration source region 1d, and the high concentration drain region 1e of each of the pixel switching TFTs 30 are constituted by the same semiconductor layer 1a. Thus, the laminated layer structure formed on the TFT array substrate 10 can be simplified. Furthermore, in a method for manufacturing an electro-optical device (to be described later), the storage capacitor lines 3b and the scanning lines 3a can be simultaneously formed at the same thin film forming step. Thus, the first dielectric film of the storage capacitor 70a and the insulating thin film 2 can be simultaneously formed.

In this embodiment, especially, the barrier layer 80 is constituted by an electrically conductive light shielding film. Therefore, each of the pixel aperture regions can be at least partly defined by the barrier layer 80. Further, the second light shielding film at the side of the opposing substrate 20 can be omitted by defining the pixel aperture portion with the barrier layer 80, or a combination of the wires having a light shielding property, such as the data lines 6a, and the films having a light shielding property formed on the TFT array substrate 10. The configuration, in which the barrier layer 80 is provided as an incorporated light shielding film instead of providing the second light shielding film 23 on the opposing substrate 20, is extremely advantageous in that the pixel aperture ratio is not lowered by the deviation in position between TFT array substrate 10 and the opposing substrate 20 in the manufacturing process.

Incidentally, the second light shielding film 23 to be provided on the opposing substrate 20 may be formed for the purpose of preventing the temperature of the liquid crystal device from rising mainly owing to the incident light, in such a manner so as to be small (or narrow) so that the film 23 does not define the pixel aperture region. In this case, the rise in temperature can be more effectively prevented by forming the second light shielding film 23 from a material having a high reflectivity, such as an Al film. Thus, when the second light shielding film 23 is formed in such a manner as to be smaller than the light shielding region on the TFT array substrate, the area of the pixel aperture region can be prevented from decreasing owing to the positional deviation between the substrates occurring in the manufacturing process.

The barrier layer 80 to be constituted by the light shielding film is constituted by a metallic simple substance, an alloy, or a metallic silicide, which contains at least one of Ti, Cr, W, Ta, Mo, and Pb that are transparent high-melting-point metals. With this constitution, the barrier layer 80 can be prevented from being broken or melted by a high temperature treatment to be performed after the barrier layer 80 is formed and treated.

Further, even when such a high-melting-point metal is in contact with the ITO film constituting the pixel electrode 9a, the difference in ionization rate therebetween prevents the high-melting-point metal from melting. Consequently, the favorable electric connection between the barrier layer 80 and the pixel electrode 9a is provided through the second contact hole 8b.

Furthermore, in this embodiment, especially, when viewed as a plane in the TFT array substrate 10, the barrier layer 80 constituted by the light shielding film is formed so that the projection of this layer onto the substrate extends between the adjoining data lines 6a along the scanning lines 3a and is in an island correspondingly to each of the pixel units, as illustrated in FIG. 2. With this configuration, the stress due to light shielding can be reduced. Moreover, part or all of a side, which extends along the scanning lines 3a, of the pixel aperture region can be defined by the barrier layer 80. Incidentally, in the case that the influence of the parasitic capacitance between the scanning line 3a and the barrier layer 80 cannot be neglected from the viewpoint of the practical design of the circuit of the device, it is preferable that the side which extends along the scanning lines 3a of the pixel aperture region at the side, at which the storage capacitor lines 3b adjoin the pixel electrodes 9a, is defined by the barrier layer 80 without providing the barrier layer 80 on the scanning lines 3a. Alternatively, in the case in which the influence of the parasitic capacitance between the scanning line 3a and the barrier layer 80 is negligible from the viewpoint of the practical design of the circuit of the device, the barrier layer 80 may be formed at a place at which this layer 80 faces the scanning lines 3a across the second dielectric film 81. With this configuration, a larger part of the side which extends along the scanning lines 3a, of the pixel aperture region can be defined by the barrier layer 80 having a light shielding property, which covers at least a part of both of the scanning lines 3a and the storage capacitor lines 3b. In other words, if the device has this configuration, it is preferable that the second dielectric film 81 is formed in such a manner as to be thick to the extent that the parasitic capacitance between the scanning line 3a and the barrier layer 80 is negligible. Alternatively, it is preferable for suppressing this parasitic capacitance to a low level that the barrier layer 80 covers only areas which are necessary to define the pixel aperture region of the scanning lines 3a.

Incidentally, it is sufficient that a side of the pixel aperture region which extends along the scanning lines 3a at the side (namely, at the lower side, as viewed in FIG. 2), at which the scanning lines 3a adjoin the pixel electrodes 9a is defined by the first light shielding film 11a and the second light shielding film 23. Moreover, it is sufficient that the side of the pixel aperture region which extends along the data lines 6a is defined by the data lines 6a constituted by Al lines, or the first light shielding film 11a, or the second light shielding film 23.

Furthermore, preferably, an end portion of the island-like barrier layer 80 placed in the direction of the scanning lines 3a slightly overlaps with an edge portion of the data line 6a, in a planar view as illustrated in FIG. 2. This prevents an occurrence of a gap therebetween, which transmits incident light. Thus, this embodiment can prevent an occurrence of a poor-quality display, such as light leakage, in this portion. Therefore, the pixel aperture portion can be defined by the combination of the data lines 6a, the barrier layer 80, and the first light shielding film 11a, or the combination of films having a light shielding property, for example, the data lines 6a, and the barrier layer 80. In this case, there is no need for forming the second light shielding film 23 on the opposing substrate 20. Thus, the step of forming the second light shielding film 23 on the opposing substrate 20 can be eliminated. Moreover, a decrease or variation in the pixel aperture ratio which would be caused by alignment deviation between the opposing substrate 20 and the TFT array substrate 10 can be prevented. Further, in the case of providing the second light shielding film 23 on the opposing substrate 20, the second light shielding film 23 is formed to be large by taking into consideration the alignment deviation between the TFT array substrate 10 and the opposing substrate 20. However, because the pixel aperture portion is defined by the data lines 6a and the films formed at the side of the TFT array substrate 10 having a light shielding property, such as the barrier layer 80, the pixel aperture portion is defined with good precision. The pixel aperture ratio can be enhanced, as compared with that in the case of defining the pixel aperture portion by the second light shielding film 23.

As described above, in this embodiment, especially, the barrier layer 80 is constituted by the conductive light shielding film so that various advantages are obtained. The barrier layer 80 may be constituted by a conductive polysilicon film doped with phosphorus, instead of the high-melting-point metal film. With this constitution, the barrier layer 80 does not serve as the light shielding film, but can fully perform the functions of increasing the storage capacitor 70 and the essential relaying function thereof. Moreover, stress hardly occurs between the barrier layer 80 and the second interlayer insulating film 4. Thus, this is serviceable to prevent the generation of cracks in and around the barrier layer 80. On the other hand, it is sufficient to shield light by using the first light shielding film 11a and the second light shielding film 23 separately from this so as to define the pixel aperture region.

Further, in this embodiment, all or part of the pixel aperture region may be defined by the first light shielding film 11a formed under the TFTs 30. The side of the pixel aperture region which extends along the scanning lines 3a can be defined by the first light shielding film 11a and the barrier layer 80 by arranging the first light shielding film 11a so that the first light shielding film 11a lies at the side of or slightly overlaps with the barrier layer 80 on a planar view, as viewed in FIG. 2.

In this embodiment, especially, the first contact hole 8a and the second contact hole 8b are opened at different positions on a plane on the TFT array substrate 10, as illustrated in FIGS. 2 and 3. This can prevent an increase in unevenness at a position at which uneven portions overlap one another, which would occur in the case that the first contact hole 8a and the second contact hole 8b were formed at the same position on the plane. Consequently, it is expected that favorable electric connection between the barrier layer and the electrode is provided.

Incidentally, the shapes of the projections of the contact holes 8a, 8b, and 5 on a plane may be circles, rectangles, or other kinds of polygons. Especially, the contact holes, whose projections on the plane are circular can serve to prevent occurrences of cracks in the interlayer insulating film there-around. Further, it is preferable that these contact holes are slightly tapered by performing wet etching after dry etching is performed.

Manufacturing Process in First Embodiment of Electro-Optical Device

Next, the process of manufacturing a liquid crystal device, which is the embodiment having the aforementioned configuration, will be described with reference to FIGS. 4 to 7. Incidentally, FIGS. 4 to 7 are process diagrams illustrating the layers at the steps of the manufacturing process at the side of the TFT array substrate in a section taken on line A—A' of FIG. 2, similar to FIG. 3.

Figure 4:
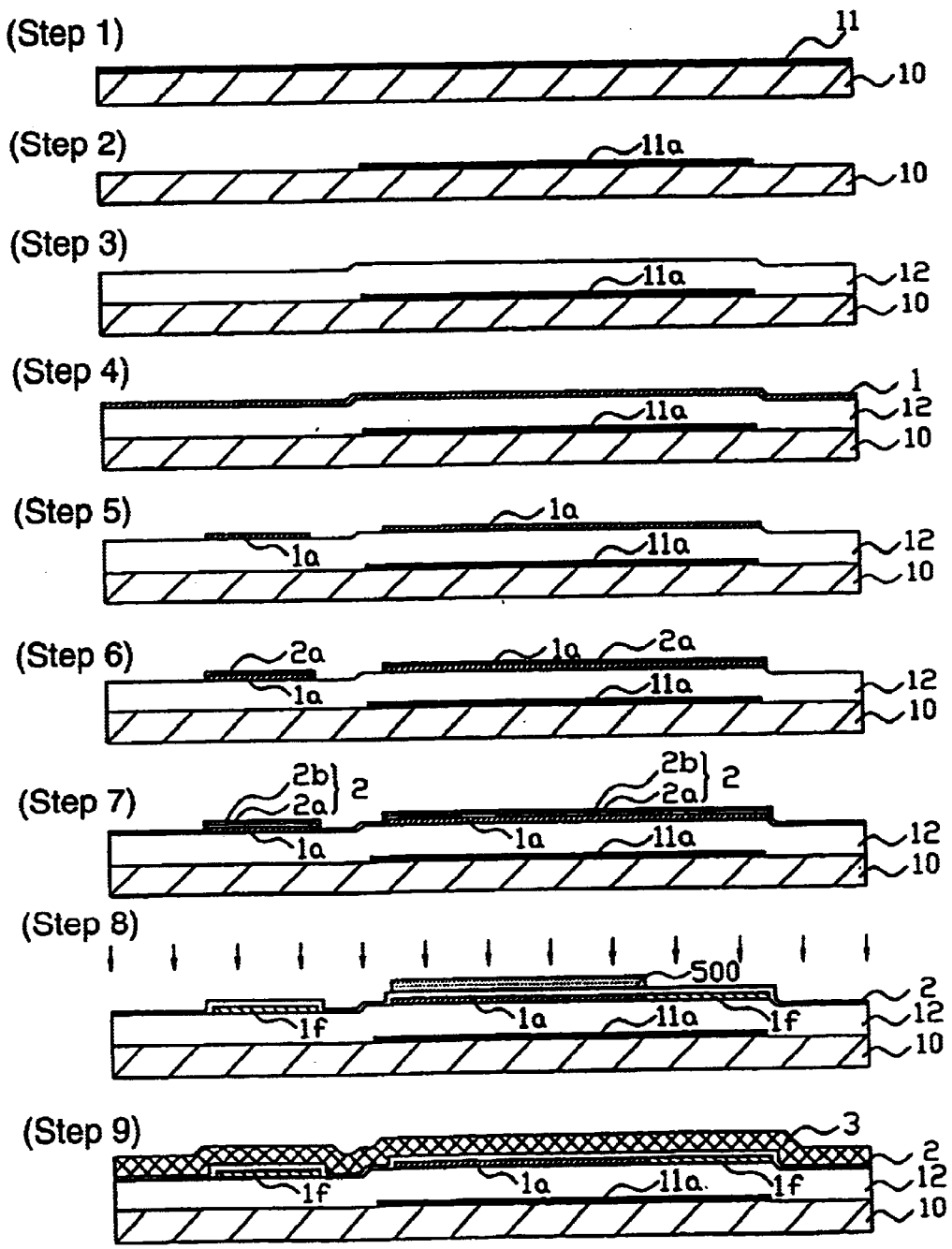
FIG. 4 is a diagram illustrating (Part 1 of) a manufacturing process of the liquid crystal device, in the first embodiment, step by step.

First, in step (1) of FIG. 4, the TFT array substrate 10, such as a quartz substrate, a hard glass substrate, or a silicon substrate, is prepared. Incidentally, preferably, a heat treatment is performed on this substrate at a high temperature of about 900 to 1300° C. in an inactive gas atmosphere containing an inactive gas, such as $N_2$ (nitrogen). Thus, a pretreatment is performed thereon so as to reduce distortion occurring in the TFT array substrate 10 in a high-temperature process to be performed later. That is, a heat treatment is preliminarily performed on the TFT array substrate 10 at a temperature adjusted to the temperature at which the high-temperature treatment is performed at the highest temperature in the manufacturing process, or a higher temperature. Further, a light shielding film 11, which is constituted by a metallic alloy film containing metals, such as Ti, Cr, W, Ta, Mo and Pb, and a metallic silicide and which has a thickness of about 100 to 500 nm, preferably, about 200 nm, is formed on the entire surface of the TFT array substrate 10 treated in this manner by sputtering. Incidentally, an antireflective coating, such as a polysilicon film, may be formed on the light shielding film 11 so as to alleviate surface reflection.

Next, as illustrated in step (2), a resist mask corresponding to a pattern (see FIG. 2) of the first light shielding film 11a is formed on the formed light shielding film 11 in a lithographic step. Then, the first light shielding film 11a is formed by performing etching on the light shielding film 11 through the resist mask.

Next, as illustrated in step (3), a underlying insulating film 12 constituted by a silicate glass film, such as NSG, PSG, BSG, or BPSG, a silicon nitride film, or a silicon oxide film is formed on the first light shielding film 11a by using a TEOS (tetraethylorthosilicate) gas, TEB (tetraethylborate) gas, or TMOP (tetramethyloxyphosrate) gas according to an atmospheric-pressure CVD method or a low pressure CVD method. The thickness of this underlying insulating film 12 is set in such a way as to range from about 500 to 2000 nm. Incidentally, there is no need for forming the first light shielding film 11a in the case that the influence of return light coming from the rear surface of the TFT array substrate 10 is negligible.

Next, as illustrated in step (4), an amorphous silicon film is formed on the underlying insulating film 12 by performing a low pressure CVD (at a pressure of about 20 to 40 Pa) using monosilane or disilane gas whose flow rate is about 400 to 600 cc/min in a relatively low temperature environment at a temperature within a range of about 450 to 550° C., preferably, at a temperature of 500° C. Thereafter, a heat treatment is performed on thereon in nitrogen atmosphere at a temperature within a range of about 600 to 700° C. for a time of about 1 to 10 hours, preferably, 4 to 6 hours, so that a polysilicon film 1 perform solid phase growth until the thickness thereof reaches a value within a range of about 50 to 200 nm, preferably, about 100 nm. A method for causing the solid phase growth of the film may be a heat treatment using RTA (Rapid Thermal Anneal), or by a laser heat treatment using an excimer laser.

In the case that n-channel type pixel switching TFTs 30 are formed as the pixel switching TFTs 30 shown in FIG. 3 at that time, the channel region may be slightly doped with impurities of a V group, such as Sb (antimony), As (arsenic), and P (phosphorus) by ion implantation. Further, in the case that p-channel type pixel switching TFTs 30 are formed as the pixel switching TFTs 30 shown in FIG. 3 at that time, the channel region may be slightly doped with impurities of a III group, such as B (boron), Ga (gallium), and In (indium) by ion implantation. Incidentally, the polysilicon film 1 may be directly formed by a low pressure CVD method, without performing a step of forming an amorphous silicon film. Alternatively, the polysilicon film 1 may be formed by forming an amorphous film once by implanting silicon ions into the polysilicon film deposited by the low pressure CVD method, and subsequently performing recrystallization of the amorphous film by a heat treatment.

Next, as illustrated in step (5), the semiconductor layer 1a having a predetermined pattern shown in FIG. 2 is formed by the photolithographic step, the etching step, and so forth.

Next, as illustrated in step (6), a relatively thin heat-oxidized silicon film 2a having a thickness of about 30 nm is formed by performing a thermal oxidation on the semiconductor layer 1a at a temperature within a range of about 900 to 1300° C., preferably, at a temperature of about 1000° C. Furthermore, as illustrated in step (7), an insulating film 2b constituted by a high-temperature oxidation silicon film (HTO film) or a silicon nitride film is deposited by a low pressure CVD method in such a way as to have a thickness of about 50 nm. Then, the first dielectric film 2 for forming a storage capacitor is formed simultaneously with the insulating thin films 2 of the pixel switching TFTs 30 having a multi-layer structure that contains the heat-oxidized silicon film 2a and the insulating film 2b. As a result, the thickness of the semiconductor layer 1a becomes about 30 to 150 nm, preferably, about 35 to 50 nm. Further, the thickness of the insulating thin film (namely, the first dielectric film) 2 becomes about 20 to 150 nm, preferably, about 30 to 100 nm. Thus, an occurrence of a warpage due to heat in the case of using a large-size 8-inch substrate can be prevented by decreasing a high-temperature oxidation time. Incidentally, the insulating thin film 2 having a single layer structure may be formed only by performing thermal oxidation on the polysilicon film 1.

Next, as illustrated in step (8), after a resist layer 500 is formed on a part of the semiconductor layer 1a other than a part to be formed as the first storage capacitor electrode 1f, by a photolithographic step or an etching step, the resistance of the first storage capacitor electrode 1f may be reduced to a low value by being doped with P-ions with a dose amount of about $3 \times 10^{12}/cm^2$.

Next, as illustrated in step (9), after the resist layer 500 is removed therefrom, a polysilicon film 3 is deposited by a low pressure CVD method. Moreover, P-ions undergo a thermal diffusion. Thus, the polysilicon film 3 is made to be conductive. Alternatively, a doped-polysilicon film, into which P-ions are introduced simultaneously with the formation of the polysilicon film 3, may be used. The polysilicon film 3 is deposited in such a way so as to have a thickness of about 100 to 500 nm, preferably, about 300 nm.

Next, as illustrated in step (10) of FIG. 5, the storage capacitor lines 3b together with the scanning lines 3a having the predetermined pattern of FIG. 2 are formed by performing a photolithographic step using the resist mask or an etching step. The scanning lines 3a and the storage capacitor lines 3b may be formed from a high-melting-point metal or a metallic alloy film, such as a metallic silicide. Alternatively, a multi-layer wire combined with a polysilicon film may be used.

Next, as illustrated in step (11), in the case that an n-channel type TFT having the LDD structure is used as each of the pixel switching TFTs 30 as shown in FIG. 3, the semiconductor layer 1a is doped with impurities of a V group, such as P, at a low concentration (for example, doped with P-ions with a dose amount of about $3 \times 10^{12}/cm^2$) by using a gate electrode which is a part of the scanning line 3a as a mask, so as to first form the low concentration source region 1b and the low concentration drain region 1c in the semiconductor layer 1a. Consequently, a part of the semiconductor layer 1a which lies under the scanning lines 3a serves as a channel region 1a'.

Next, as illustrated in step (12), the resist layer 600 is formed on the scanning lines 3a by using a mask whose width is wider than that of the scanning line 3a, so as to form the high concentration source region 1d and the high concentration drain region 1e of each of the pixel switching TFTs 30. Thereafter, this layer is doped with impurities, namely, elements of the V group, such as P, at a high concentration (that is, for example, doped with P-ions with a dose amount of about $3 \times 10^{15}/cm^2$). Further, in the case that a p-channel type TFT is used as each of the pixel switching TFTs 30, the semiconductor layer 1a is doped with impurities, namely, elements of a III group, such as B, so as to form the low concentration source region 1b, the low concentration drain region 1c, the high concentration source region 1d, and the high concentration drain region 1e. Incidentally, for instance, a TFT having the offset structure may be used without doping the layer with impurities of a low concentration. Alternatively, a self-alignment type TFT may be used by utilizing the ion implantation techniques which use P-ions and B-ions, and employing the scanning lines 3a as a mask. As a result of being doped with such impurities, the resistance of the storage capacitor lines 3b and the scanning lines 3a is reduced to a further lower value.

Incidentally, simultaneously with the step of forming elements of each of the TFTs 30, the peripheral circuits, such as the data line driving circuit, and the scanning line driving circuit, which have a complementary structure consisting of the n-channel type TFTs and the p-channel type TFTs, may be formed on the peripheral portion of the TFT array substrate 10. Thus, in this embodiment, the peripheral circuits can be formed nearly at the same step when the pixel switching TFTs 30 are formed, by forming the semiconductor layer 1a of each of the pixel switching TFTs 30 from the polysilicon film. This is advantageous for manufacturing of the device.

Next, as illustrated in step (13), after the resist layer 600 is removed therefrom, the first interlayer insulating film 81 constituted by a high-temperature oxidation silicon film (namely, a HTO film) or a silicon nitride film is deposited on the storage capacitor lines 3b, the scanning lines 3a, and the insulating thin film (namely, the first dielectric film) 2 by a low pressure CVD method or a plasma CVD method, in such a manner so as to have a relatively small thickness of 10 nm to 200 nm. Incidentally, as described above, the first interlayer insulating film 81 may be constituted by a multi-layer film. The first interlayer insulating film 81 can be formed by various kinds of generally known techniques used for forming TFT insulating thin films. In the case of the first interlayer insulating films 81, even if the thickness thereof is too small, the parasitic capacitance between the data lines 6a and the scanning lines 3a which would become too large in the case of forming the second interlayer insulating film 4 in such a way so as to have a too small thickness, does not become too large. Moreover, peculiar phenomena, such as a tunnel effect, which would occur in the case of forming the insulating thin film 2 on the TFT 30 in such a manner as to have a too small thickness, does not occur. Furthermore, the first interlayer insulating film 81 serves as the second dielectric film between the second storage capacitor electrode, which is a part of the storage capacitor me, and the barrier layer 80. Further, the thinner the second dielectric film 81, the larger the second capacitor 70b. Eventually, on condition that no film breakage occurs, the advantageous effects of this embodiment are enhanced by forming the insulating thin film 2 in such a way as to be an extremely thin insulating film having a thickness which is not more than 50 nm.

Next, as illustrated in step (14), a contact hole 8a for electrically connecting the barrier layer 80 to the high concentration drain region 1e is formed by dry etching, such as reactive ion etching, or reactive ion beam etching. Such dry etching is high in directivity, so that the contact hole 8a can be formed in such a manner as to have a small diameter. Attentively, wet etching, which is advantageous in that the penetration of the contact hole 8a through the semiconductor layer 1a is prevented, may be also employed. This wet etching technique is effective from the viewpoint of tapering the contact hole 8a so as to provide more favorable electrical connection therebetween.

Next, as illustrated in step (15), a metallic film containing Ti, Cr, W, Ta, Mo, and Pb, or a metallic alloy film such as a metallic silicide, is deposited on the first interlayer insulating film 81 and the entire surface of a part, which is exposed through the contact hole 8a, of the surface of the high concentration drain region 1e by sputtering. Thus, a conductive film 80' having a thickness of 50 to 500 nm or so is formed. If the film 80' has a thickness of 50 nm or so, there is almost no possibility that the film 80' is penetrated at the time of forming the second contact hole 8b later. Incidentally, antireflective coating, such as a polysilicon film, for alleviating the surface reflection may be formed on this conductive film 80'. Further, the conductive film 80' may be constituted by a doped polysilicon film so as to lower the stress. At that time, the conductive layer 80' may be formed as a laminated layer in such a manner so as to have two or more layers that includes a lower layer constituted by a doped polysilicon film (namely, a conductive polysilicon layer) and an upper layer constituted by a metallic film. Furthermore, the film 80' may be formed in such a way so as to have three layers by putting a metallic film between the same polysilicon films. The contact resistance can be considerably reduced by forming the conductive film 80' and the high concentration drain region 1e from the same polysilicon film when the conductive film 80' is electrically connected to the region 1e.

Next, as illustrated in step (16) in FIG. 6, the barrier layer 80 containing third storage capacitor electrode is formed by forming a resist mask corresponding to the pattern (see FIG. 2) of the barrier layer 80 by a photolithographic technique, and then performing etching on the conductive film 80' through the resist mask.

Next, as illustrated in step (17), the second interlayer insulating film 4 comprising a silicate glass film, such as NSG, PSG, BSG, or BPSG film, or a silicon nitride film, or a silicon oxide film is formed by, for example, an atmospheric-pressure CVD method, or a low pressure CVD method, and using a TEOS gas in such a manner as to cover the first interlayer insulating film 81 and the barrier layer 80.

The thickness of the second interlayer insulating film 4 is, preferably, 500 to 1500 nm. If the thickness of the second interlayer insulating film 4 is not less than 500 nm, the influence of the parasitic capacitance between the data lines 6a and the scanning lines 3a is almost or entirely negligible.

Next, as illustrated in step (18), a heat treatment is performed at a temperature of about 1000° C. for 20 minutes or so, in order to activate the high concentration source region 1d and the high concentration drain region 1e. Thereafter, a contact hole 5 is opened for the data line 6a. Further, contact holes for connecting wires (not shown) to the scanning lines 3a and the storage capacitor lines 3b in the peripheral region of the TFT array substrate 10 can be formed in the second interlayer insulating film 4 at the same process as that for forming the contact hole 5.

Next, as illustrated in step (19), low resistance metal, such as Al, and a metallic silicide, which have a light shielding property, is deposited as a metallic film 6 on the second interlayer insulating film 4 in such a manner as to have a thickness of about 100 to 500 nm, preferably, about 300 nm.

Next, as illustrated in step (20), the data lines 6a are formed by performing a photolithographic step or an etching step.

Next, as illustrated in step (21), a third interlayer insulating film 7 constituted by a silicate glass film such as NSG, PSG, BSG or BPSG film, a silicon nitride film, or a silicon oxide film is formed by utilizing an atmospheric-pressure CVD method, or a low pressure CVD method, and a TEOS gas so as to cover the data line 6a. The thickness of the third interlayer insulating film 7 is, preferably, about 500 to 1500 nm.

Next, as illustrated in step (22), a contact hole 8b for electrically connecting the pixel electrode 9a to the barrier layer 80 is formed by dry etching, such as reactive ion etching, or reactive ion beam etching. Further, wet etching may be used so as to taper the contact hole.

Next, as illustrated in step (23), a transparent conductive thin film 9, such as an ITO film, is deposited on the third interlayer insulating film 7 in such a manner as to have a thickness of about 50 to 200 nm by sputtering or the like. Furthermore, as illustrated in step (24), the pixel electrodes 9a are formed by performing a photolithographic step or an etching step. Incidentally, in the case of using the liquid crystal device in a reflection type liquid crystal device, the pixel electrodes 9a may be formed from an opaque material, such as Al, which has a high reflectivity.

Subsequently, a coating liquid for forming a polyimide alignment film is applied onto the pixel, electrodes 9a. Thereafter, an alignment film 16 (see FIG. 3) is formed by performing rubbing treatment in a predetermined direction in such a manner as to have a predetermined pretilt angle.

On the other hand, in the case of the opposing substrate 20 shown in FIG. 3, first, a glass substrate is prepared. Then, the second light shielding film 23 and the third light shielding film, which serves as a picture-frame, are formed through a photolithographic step and an etching step after, for example, metallic chrome is sputtered. Incidentally, the second and third light shielding films may be formed from metallic materials, such as Cr, N, Al, or materials, such as a resin black, obtained by dispersing carbon or Ti in a photo resist. Incidentally, the second light shielding film 23 and third light shielding film on the opposing substrate 20 can be omitted by defining a light shielding region by the data lines 6a, the barrier layer 80, and the first light shielding film 11a on the TFT array substrate 10.

Thereafter, the opposing electrode 21 is formed by depositing a transparent conductive thin film, such as ITO film, on the entire surface of the opposing substrate 20 in such a manner so as to have a thickness of about 50 to 200 nm by spattering or the like. Furthermore, after the coating liquid for polyimide alignment films are applied onto the entire surface of the opposing electrode 21, the alignment film 22 (see FIG. 3) is formed by performing rubbing treatment in a predetermined direction in such a manner as to have a predetermined pretilt angle.

Finally, the TFT array substrate 10 and the opposing substrate 20, on each of which the aforementioned layers are formed, are bonded by using a seal material (to be described later) so that the alignment films 16 and 22 face each other. Then, the liquid crystals obtained by mixing a plurality of kinds of nematic liquid crystals are sucked into a space between these substrates by vacuum suction. Thus, the liquid crystal layer 50 having a predetermined thickness is formed.

Second Embodiment of Electro-Optical Device

Figure 8:
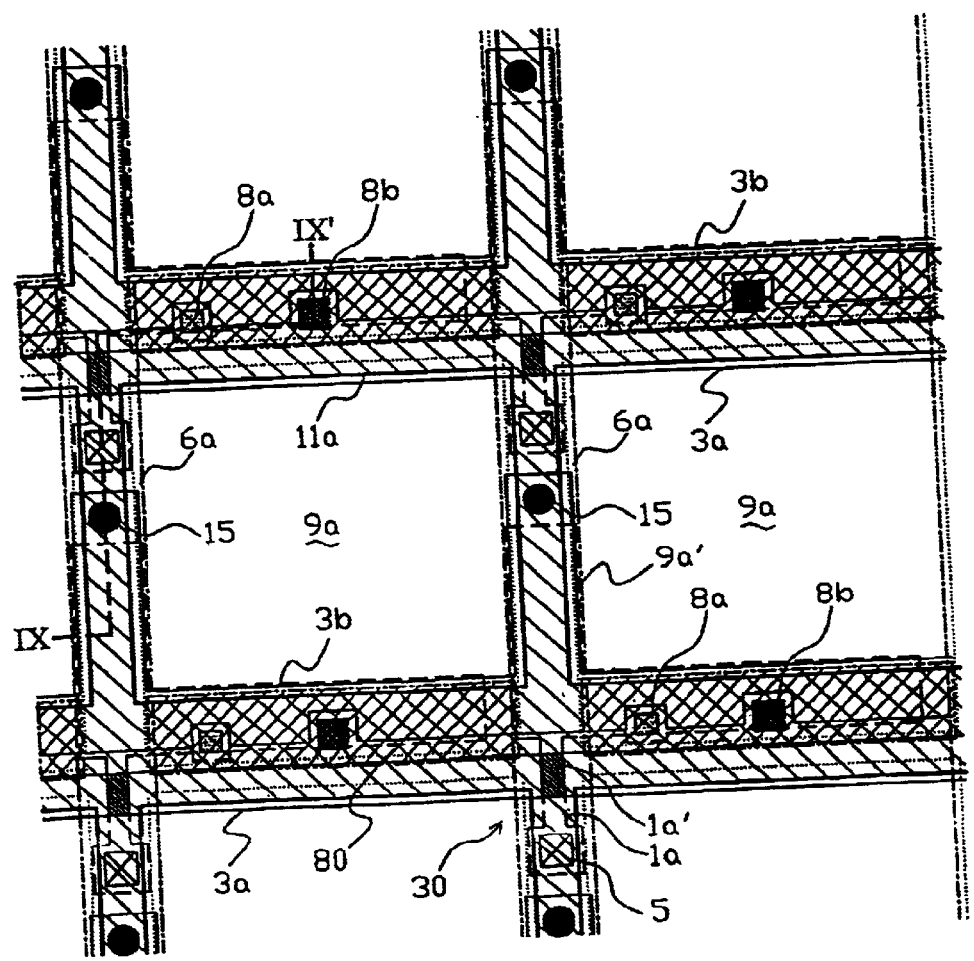
FIG. 8 is a plan diagram illustrating the plurality of adjacent pixels arranged on a TFT array, on which data lines, scanning lines, pixel electrodes, and a light shielding film are formed, in a liquid crystal device, in a second embodiment of the present invention.
Figure 9:
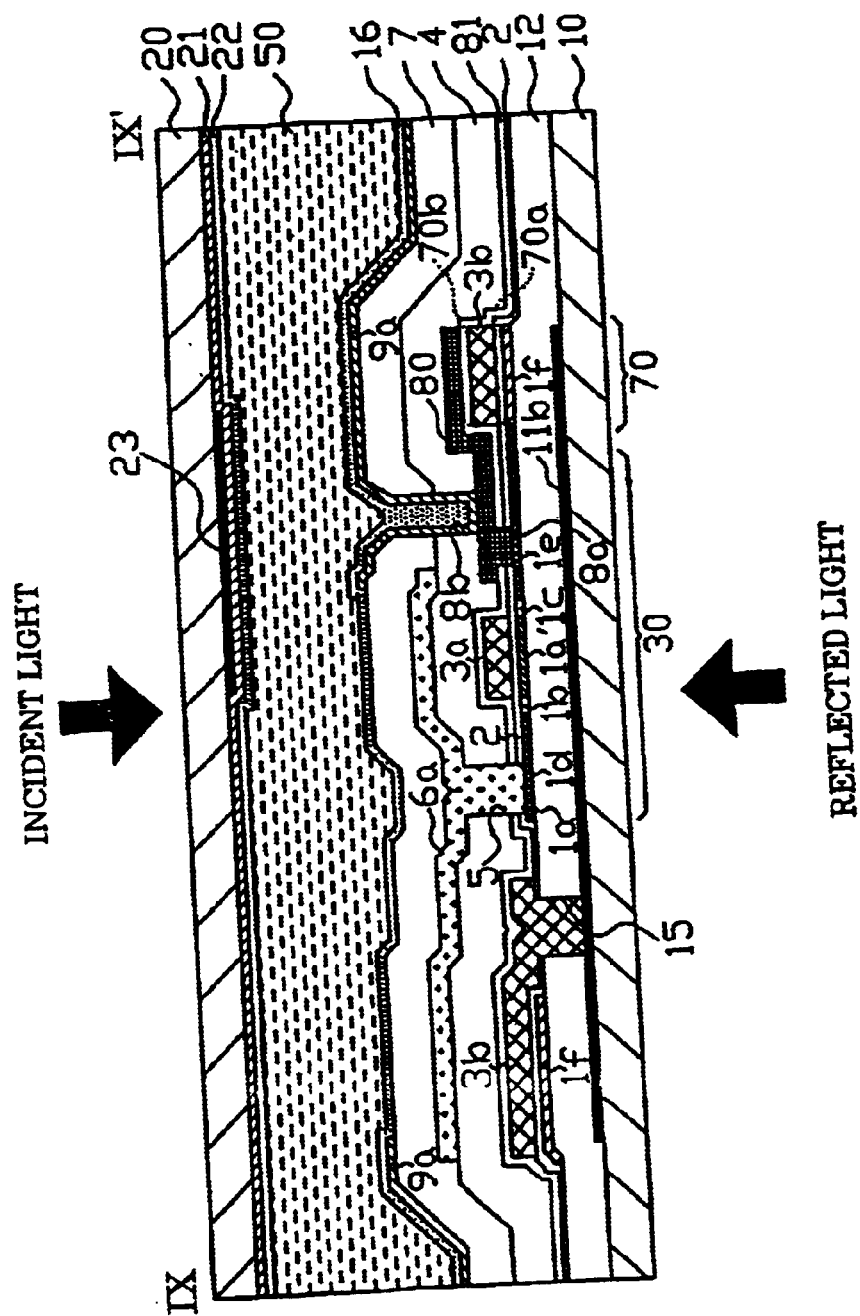
FIG. 9 is a sectional view taken on line IX—IX' of FIG. 8.

The configuration of a liquid crystal device, which is a second embodiment of an electro-optical device of the present invention, will be described by referring to FIGS. 8 and 9. FIG. 8 is a plan diagram illustrating the plurality of adjacent pixels arranged on a TFT array substrate, on which data lines, scanning lines, pixel electrodes, and a light shielding film are formed in this liquid crystal device. FIG. 9 is a sectional view taken on line IX—IX' of FIG. 8. Incidentally, the constituent elements similar to those of the first embodiment, which are shown in FIGS. 2 and 3, are designated by like reference characters in these figures, and the descriptions of such constituent elements are omitted herein. Further, in FIG. 9, a scale factor is allowed to vary with layers and members so that such layers and members are recognizable in this figure.

As shown in FIGS. 8 and 9, in the second embodiment, the first light shielding film 11b is provided in such a manner so as to cover the scanning lines 3a, the storage capacitor lines 3b, and the data lines 6a, when viewed from the side of the TFT array substrate 10, differently from the first embodiment, that is, provided on the entirety of the grid-like non-aperture region surrounding each of the pixels. Furthermore, a contact hole 15 for electrically connecting the storage capacitor line 3b to the first light shielding film 11b is provided on the underlying insulating film 12. The storage capacitor line 3b and the first light shielding film 11b are connected to a constant potential wire in the peripheral area of the substrate. The remaining constituent elements of the second embodiment are similar to the corresponding constituent elements of the first embodiment.

Therefore, according to the second embodiment, the first light shielding film 11b has not only the functions of defining the pixel aperture regions, and serving as the constant potential wire corresponding to the storage capacitor line 3b and the redundant wire, but also the capabilities of lowering the resistance of the storage capacitor line itself and improving the picture quality of a displayed image. Additionally, the electric potential of the storage capacitor line 3b can be made to be equal to that of the first light shielding film 11b. Further, a negative influence of fluctuation in the level of the electric potential of each of the storage capacitor line 3b and the first light shielding film 11b on image signals and the TFTs 30 can be reduced. Furthermore, the underlying insulating film 12 interposed between the first light shielding film 11b and the semiconductor layer 1a is formed as a dielectric film. Moreover, storage capacitance can be added thereto.

Further, the storage capacitor line 3b, which is formed in the same step as that of forming the scanning lines 3a, may be provided like an island as a storage capacitor electrode which corresponds to each of the pixels, by using the first light shielding film 11b as a storage capacitor line. With this configuration, the pixel aperture ratio can be enhanced.

Incidentally, such a first light shielding film 11b can be formed by changing the pattern of the resist mask in step (2) of the manufacturing process of the first embodiment. Furthermore, the contact hole 15 may be formed by performing dry etching methods, such as a reactive ion etching method or a reactive ion beam etching method, and a wet etching method in a time period between steps (8) and (9) of the manufacturing process of the first embodiment.

Third Embodiment of Electro-Optical Device

Figure 10:
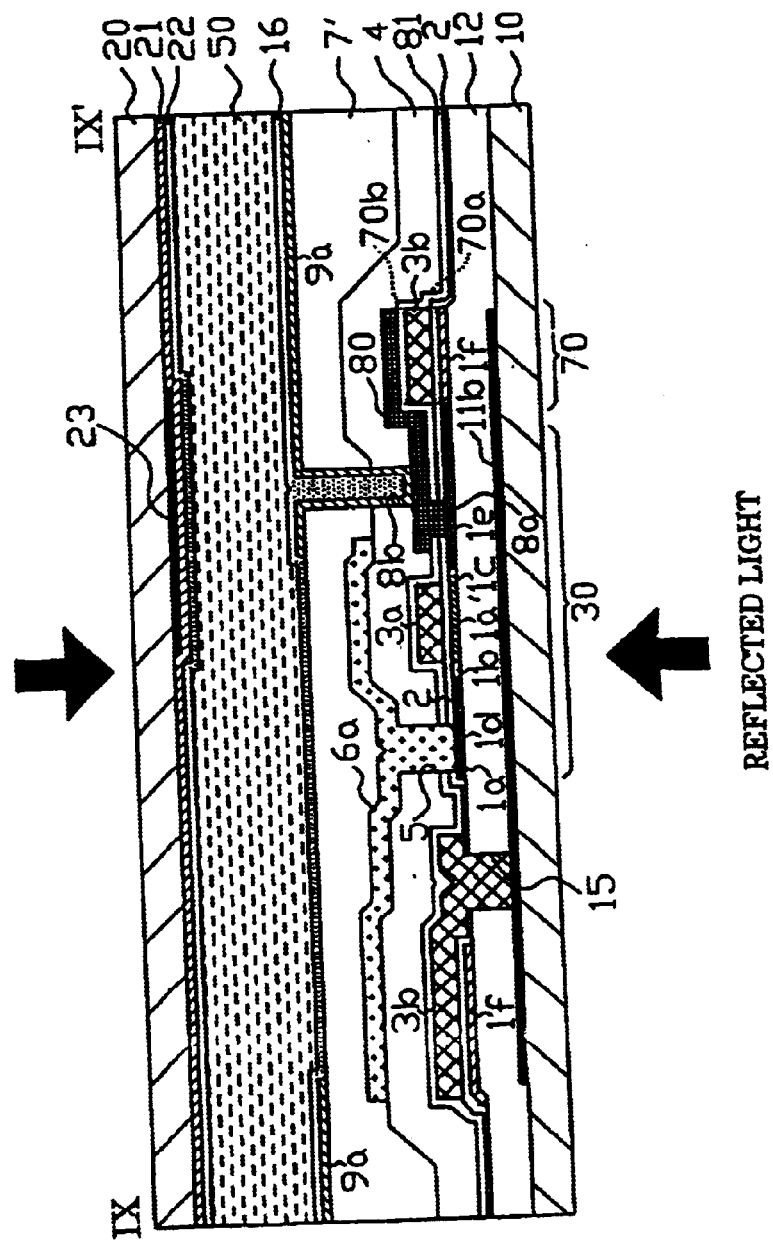
FIG. 10 is a sectional view of a liquid crystal device in a third embodiment of the electro-optical device.

The configuration of a liquid crystal device, which is a third embodiment of an electro-optical device of the present invention, will be described by referring to FIG. 10. FIG. 10 is a sectional view of the third embodiment corresponding to the sectional view of the second embodiment, which is taken on line IX—IX' of FIG. 8. Incidentally, in the third embodiment shown in FIG. 10, the constituent elements similar to those of the second embodiment, which are shown in FIG. 8, are designated by like reference characters in FIG. 8, and the descriptions of such constituent elements are omitted herein. Further, in FIG. 10, a scale factor is allowed to vary with layers and members so that such layers and members are recognizable in this figure.

As shown in FIG. 10, in the case of the third embodiment, the third interlayer insulating film 7' is formed so that the top surface thereof is flat, different from the second embodiment. As a result, the pixel electrodes 9a and the alignment film 16, which employ the third interlayer insulating film 7' as an underlying film, are flattened. The rest of the constituent elements of the third embodiment are similar to the corresponding constituent elements of the second embodiment.

Therefore, according to the third embodiment, the difference in height between a region in which the scanning lines 3a, the TFTs 30, and the storage capacitor lines 3b are formed in such a way so as to overlap with the data lines 6a, and each of the other regions is reduced. The pixel electrodes 9a are flattened in this way so that the possibility of occurrences of disclination in the liquid crystal layer 50 can be lowered according to the degree of flattening thereof. As a result, according to the third embodiment, a higher picture-quality image display is realized. Moreover, the pixel aperture region can be enlarged.

Incidentally, the flattening of such a third interlayer insulating film 7' may be performed by effecting a CMP (Chemical Mechanical Polishing) treatment, or a spin coating treatment, or a reflow method and utilizing organic SOG (Spin On Glass), inorganic SOG, or a polyimide film in step (21) of the manufacturing process of the first embodiment. Even if the thickness of the third interlayer insulating film 7' is large, as a result of such flattening, the penetration of a hole therethrough does not occur because of the fact that the barrier layer 80 is constituted by a film having a high selectivity.

Fourth Embodiment of Electro-Optical Device

Figure 11:
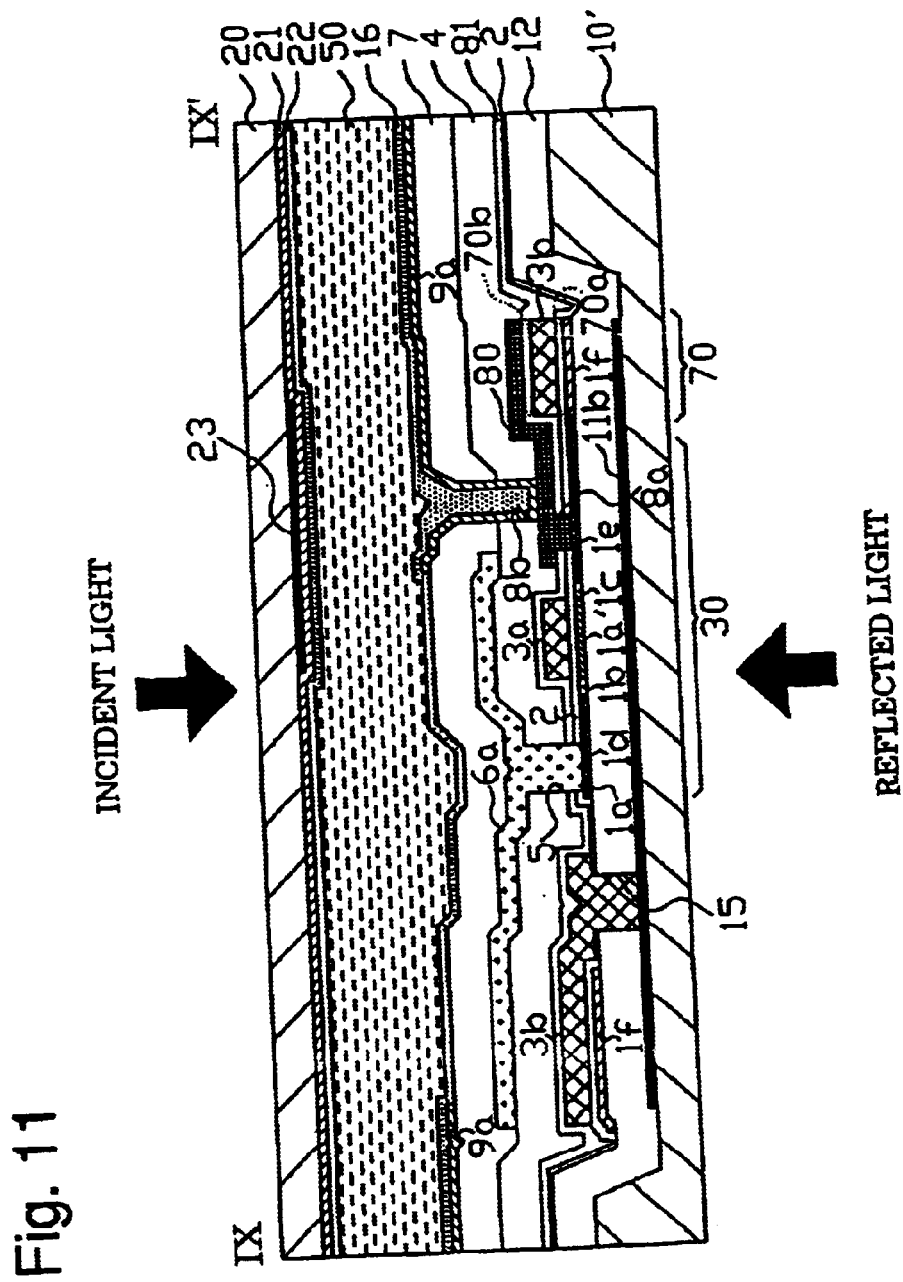
FIG. 11 is a sectional view of a liquid crystal device in a fourth embodiment of the electro-optical device.

The configuration of a liquid crystal device, which is a fourth embodiment of an electro-optical device of the present invention, will be described by referring to FIG. 11. FIG. 11 is a sectional view of the fourth embodiment corresponding to the sectional view of the second embodiment, which is taken on line IX—IX' of FIG. 8. Incidentally, in the fourth embodiment shown in FIG. 10, the constituent elements similar to those of the second embodiment, which are shown in FIG. 8, are designated by like reference characters in FIG. 8, and the descriptions of such constituent elements are omitted herein. Further, in FIG. 11, a scale factor is allowed to vary with layers and members so that such layers and members are recognizable in this figure.

As shown in FIG. 11, in the case of the fourth embodiment, the TFT array substrate 10' is formed so that parts of the top surface thereof, which respectively face the data lines 6a, the scanning lines 3a, and the storage capacitor lines 3b, are dented like a concave depressions, different from the second embodiment. As a result, the pixel electrodes 9a and the alignment film 16, which are formed through such wires, and the interlayer insulating film, are flattened. Other configurations are the same as that of the second embodiment.

Therefore, according to the fourth embodiment, the difference in height between a region in which the scanning lines 3a, the TFTs 30, and the storage capacitor lines 3b are formed in such a way as to overlap with the data lines 6a, and each of the other regions is reduced. The pixel electrodes 9a are flattened only by filling up at least part of the non-aperture region of each of the pixels in this way, so that the possibility of occurrences of disclination in the liquid crystal layer 50 can be lowered according to the degree of flattening thereof. As a result, according to the fourth embodiment, a higher picture-quality image display is realized. Moreover, the pixel aperture region can be enlarged.

Incidentally, for producing such a TFT array substrate 10', it is sufficient to perform etching on regions to be provided with concave depressions, for example, before performing the treatment in step (1) of the manufacturing process of the first embodiment.

Although the top surface of the third interlayer insulating film is flattened in the third embodiment, and the pixel electrodes of the fourth embodiment are finally flattened by forming the wires and elements on the concave grooves formed in the substrate, as described above, similar effects of flattening can be obtained by denting the second interlayer insulating film 4 or the underlying insulating film 12 with concave depressions. In this case, a method of forming each of the interlayer insulating films with concave depressions is to form a thin film and etching so that each of the interlayer insulating films has a double layer structure, and that thin portions each having only a single layer, which are used as the bottom portions of the concave depressions, and that thick portions each having two layers are used as bank portions of the concave depressions. Alternatively, each of the interlayer insulating films are made to have a single layer structure, and the concave depressions are formed in such interlayer insulating films. In these cases, the application of dry etching methods, such as a reactive ion etching and a reactive ion beam etching, is advantageous in that the concave depressions can be formed just as designed. On the other hand, in the case of using at least a wet etching method singly, or a combination of a wet etching method and a dry etching method, the side wall surfaces of the concave depressions can be tapered. Thus, the residual polysilicon films and resists formed on the side wall surfaces of the concave depressions in a post-process can be reduced. Consequently, this method is advantageous in that the yield of the device is not reduced.

Fifth Embodiment of Electro-Optical Device

Figure 12:
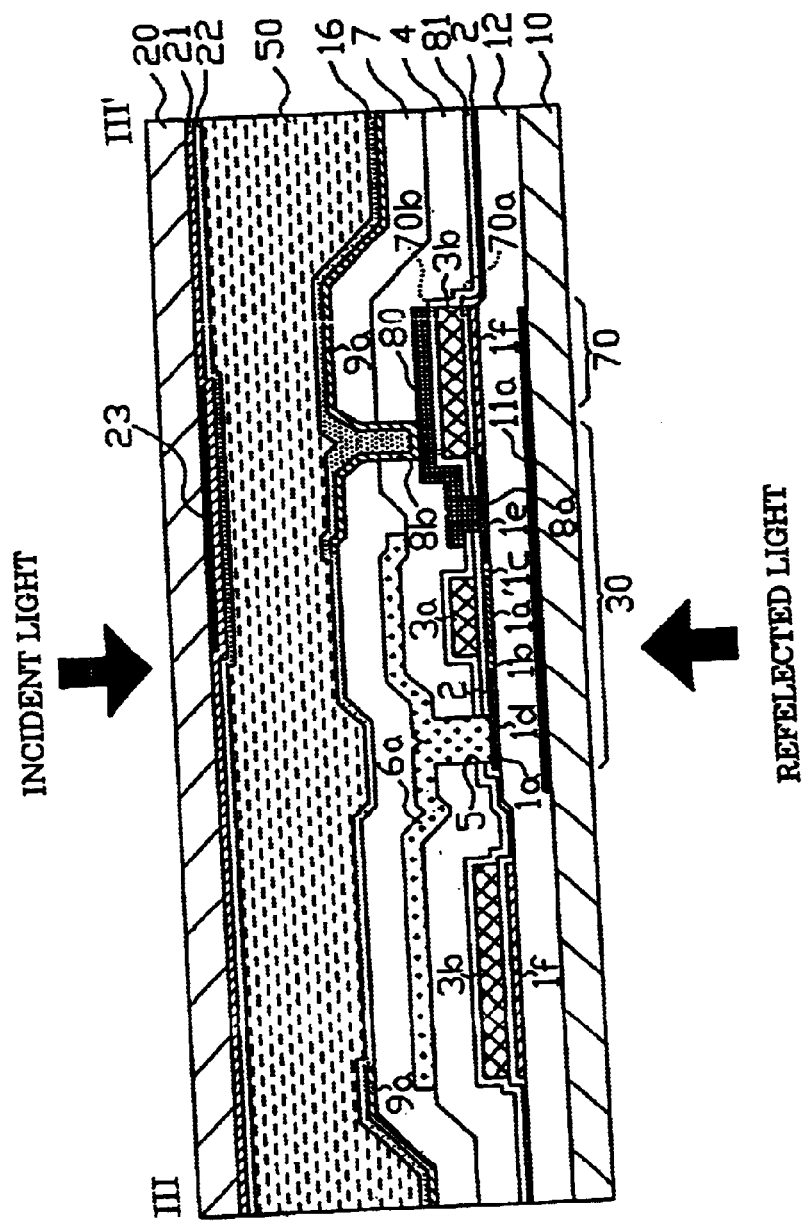
FIG. 12 is a sectional view of a liquid crystal device in a fifth embodiment of the electro-optical device.

The configuration of a liquid crystal device, which is a fifth embodiment of an electro-optical device of the present invention, will be described by referring to FIG. 12. FIG. 12 is a sectional view of the fifth embodiment corresponding to the sectional view of the first embodiment, which is taken on line III—III' of FIG. 2. Incidentally, in the fifth embodiment shown in FIG. 12, the constituent elements similar to those of the first embodiment, which are shown in FIG. 12, are designated by like reference characters in FIG. 12, and the descriptions of such constituent elements are omitted herein.

In the case of the fifth embodiment, the second contact hole 8b for electrically connecting the barrier layer 80 to the pixel electrode 9a is formed above the storage capacitor lines 3b. A portion having the area, which lies under the second contact hole 8b can serve as a capacitor, as a result of forming the second contact hole 8b above the storage capacitor lines 3b. The capacitance of the device can be increased for that.

Whole Configuration of Electro-Optical Device

Figure 13:
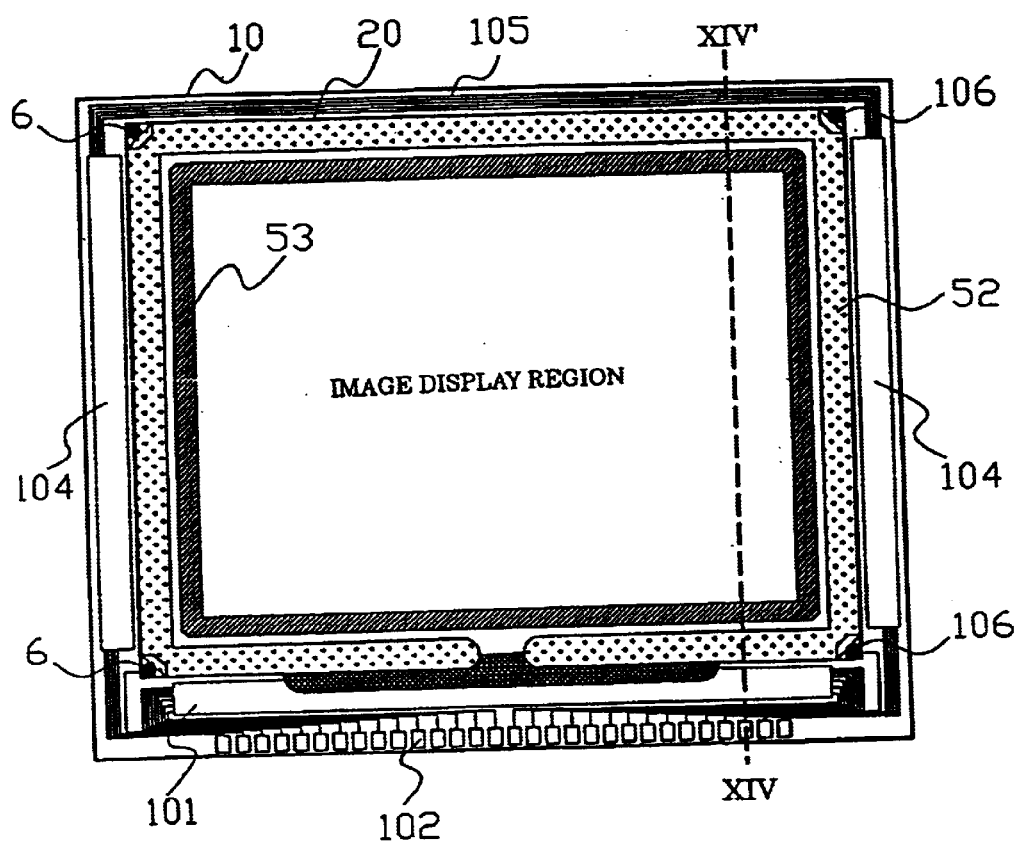
FIG. 13 is a plan diagram illustrating the TFT array substrate and constituent elements provided thereon, as viewed from an opposing substrate, in the liquid crystal device, in each of the embodiments.
Figure 14:
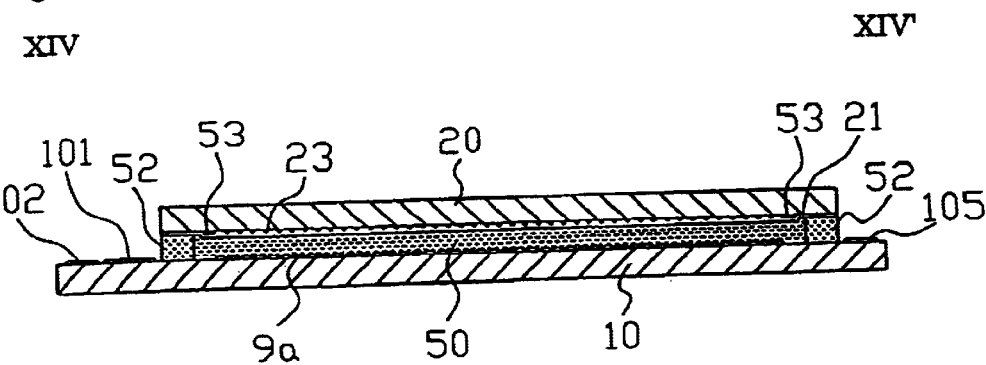
FIG. 14 is a sectional view taken on line XIV—XIV' FIG. 12.

The whole configuration of the liquid crystal device, which is an example of the electro-optical device having the aforementioned constitution of each of the embodiments, will be described hereunder by referring to FIGS. 13 and 14. Incidentally, FIG. 13 is a plan diagram illustrating the TFT array 10 and the constituent elements provided thereon, as viewed from the opposing substrate 20. FIG. 14 is a sectional view taken on line H—H' of FIG. 13.

As shown in FIG. 13, the seal member 52 is provided on the TFT array substrate 10 along the edges thereof. A third light shielding film 53, which is made of the same material as or a material different from the material of the second light shielding film 23, and which serves as a picture-frame for defining the portion around the image display region, is provided in parallel with the inside surfaces of the seal member 52. In regions outside the seal member 52, a data line driving circuit 101 for driving the data lines 6a by supplying image signals thereto with predetermined timing, and external circuit connection terminals 102 are provided along one of the sides of the TFT array substrate 10. Moreover, a scanning line driving circuit 104 for driving the scanning lines 3a by supplying scanning signals thereto with predetermined timing is provided along other two sides, which adjoin the side corresponding to the data line driving circuit 101, of the TFT array substrate 10. Needless to say, if a delay in the scanning signal to be supplied to the scanning lines 3a is negligible, the device has only to be provided with only one of the scanning line driving circuits 104. Further, data line driving circuits 101 may be placed on and along both sides of the image display regions. For instance, the odd-numbered data lines 6a may be supplied with image signals from the data line driving circuit disposed along one of the sides of the image display region, while the even-numbered data lines 6a may be supplied with image signals from the data line driving circuit disposed along the opposite side of the image display region. If the data lines 6a alternately selected in this manner are driven, the area of the data line driving circuit can be increased. Thus, a complex circuit can be configured. Further, a plurality of wires 105 for connecting the scanning line driving circuits 104 disposed on both sides of the image display region are provided on the remaining one of the sides of the TFT array substrate 10. Furthermore, an electrically conducting member 106 for providing electrical connection between the TFT array substrate 10 and the opposing substrate 20 is provided on at least one of the corner portions of the opposing substrate 20. Furthermore, as illustrated in FIG. 14, the opposing substrate 20, which has almost the same outline as of the sealing member 52 shown in FIG. 13, is securely fixed to the TFT array substrate 10 by using the sealing member 52. Incidentally, a sampling circuit for applying image signals with predetermined timing to the plurality of data lines 6a, a precharge circuit for supplying precharge signals having predetermined signal levels to the plurality of data lines 6a in such a way so as to precede the image signals, an inspection circuit for checking the quality and defects of the liquid crystal device during manufactured or when shipped are provided on the TFT array substrate 10 in addition to the data line driving circuit 101 and the scanning line driving circuit 104. Incidentally, according to this example, it is sufficient to form the second light shielding film 23 on the opposing substrate 20 in such a manner as to be smaller than the light shielding region of the TFT array substrate 10. Furthermore, the second light shielding film 23 can easily be removed therefrom according to the use of the liquid crystal device.

In each of the embodiments illustrated by referring to FIGS. 1 to 14, the data lines and the scanning lines may be electrically and mechanically connected to driving LSIs mounted on a TAB (Tape Automated Bonding) substrate through an anisotropic conductive film provided in a peripheral portion of the TUT array substrate 10, instead of providing the data line driving circuit 101 and the scanning line driving circuits 104 on the TFT array substrate 10. Further, a polarization film, a retardation film, and a polarizer are placed in directions predetermined according to, for example, operation modes, such as a TN (Twisted Nematic) mode, a VA (Vertically Aligned) mode, a PDLC mode (Polymer Disperse Liquid Crystal) mode, the normally white mode, and the normally black mode, at each of the side of the opposing substrate 20, upon which projection light is incident, and the side of the TFT array substrate 10, from which output light is outputted The aforementioned embodiments of the electro-optical device is applied to a color projector. Thus, the electro-optical devices are respectively used as light valves for R (red), G (green), and B (blue) light rays. Each of these color light rays obtained by letting emitted light traveling through a dichroic mirror for RGB color separation is impinged upon a corresponding one of these light valves as incident light therefor. Therefore, in each of the embodiments, no color filters are provided on the opposing substrate 20. However, a RGB color filter and a protecting film therefor may be formed in a predetermined region facing the pixel electrodes 9a on the opposing substrate 20, on which the second light shielding film 23 is not formed. Alternatively, a color filter layer can be formed by using a color resist under the pixel electrode 9a facing a corresponding one of the RGB light valves on the TFT array substrate 10. Thus, the embodiments of the electro-optical device can be applied to color liquid crystal television sets of the direct view type and those of the reflection type other than the projectors. Furthermore, a micro-lens may be provided on the opposing substrate 20 corresponding to each of the pixels. Additionally, an electro-optical device providing bright light is realized by improving the incident-light condensing efficiency thereof. Besides, dichroic filters for providing RGB color light rays by utilizing optical interference may be formed on the opposing substrate 20 by depositing a number of interference layers differing in refractive index from one another. A color electro-optical device providing brighter light is realized by such an opposing substrate provided with this dichroic filter.

In the case of the aforementioned embodiments of the electro-optical device, incident light is impinged from the side of the opposing substrate 20, similar to the case of the prior art device. However, each of the embodiments has the first light shielding film 11a. Thus, the electro-optical device may be adapted so that incident light is impinged from the side of the TFT array substrate 10, and that output light is thereafter outputted from the side of the opposing substrate 20. Namely, even if the electro-optical devices are mounted on the liquid crystal projector in this manner, light can be prevented from entering the channel region 1a', the low concentration source region 1b, and the low concentration drain region 1c of the semiconductor layer 1a. Moreover, a high-picture quality image can be displayed. Incidentally, the prior art devices are required to have an additional polarizer coated with an AR (Anti-Reflection) coat for preventing reflection of light, so as to prevent light from being reflected on the back surface of the TFT array substrate 10. Alternatively, the prior art device need to have an additional AR film adhering thereto. However, in each of the embodiments, the fast light shielding film 11a is formed between the surface of the TFT array substrate 10 and at least one of the channel region 1a', the low concentration source region 1b, and the low concentration drain region 1c of the semiconductor layer 1a. This eliminates the necessity for using such an AR-coated polarizer or AR film, and for using the substrate obtained by performing an antireflection treatment on the TFT array substrate 10 itself.

Therefore, according to the embodiments, the cost of the materials of the device can be reduced. Further, when the polarizer is attached to the device, the yield thereof is not reduced by dusts and scratches. Thus, the embodiments of the electro-optical devices are very advantageous. Furthermore, the electro-optical devices of the present invention has good light resistance, so that deterioration in picture quality, such as a crosstalk, does not occur even when a light source providing bright light is used, or even when the light utilization efficiency thereof is improved by performing polarization conversion by means of a polarization beam splitter.

Further, in the foregoing description, it has been described that a polysilicon TFT of the positive stagger type or the coplanar type is used as the switching elements provided at each of the pixels. Each of the embodiments is effective in the case that TFTs of other types, such as TFTs of the reverse stagger type and amorphous TFTs, are used as the switching elements.

Electronic Equipment

Next, embodiments of electronic equipment having the electro-optical device 100 as detailedly described above will be described hereunder with reference to FIGS. 15 to 17.

Figure 15:
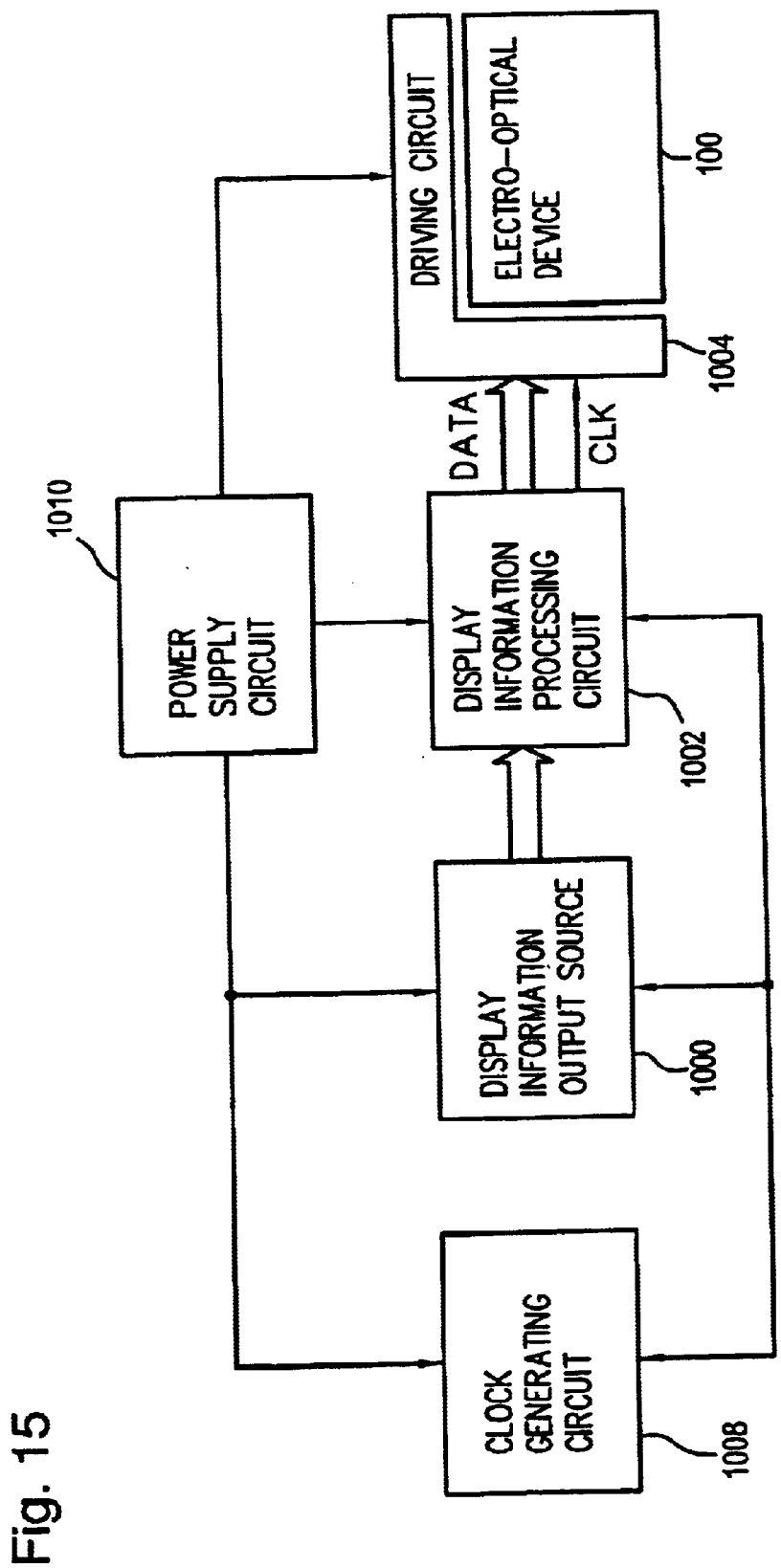
FIG. 15 is a block diagram schematically illustrating the configuration of an embodiment of electronic equipment of the present invention.

Referring first to FIG. 15, there is schematically shown the configuration of the electronic equipment having the electro-optical device 100.

As shown in FIG. 15, the electronic equipment has a display information output source 1000, a display information processing circuit 1002, a driving circuit 1004, an electro-optical device 100, a clock generating circuit 1008, and a power supply circuit 1010. The display information output source 1000 includes storage devices, such as a ROM (Read-Only Memory), a RAM (Random Access Memory), and an optical disk unit, and a synchronization circuit for synchronizing and outputting image signals. Further, the display information output source 1000 outputs display information represented by image signals having a predetermined format, to a display information processing circuit 1002 according to clock signals outputted from the clock generating circuit 1008. The display information processing circuit 1002 includes various kinds of known processing circuits, such as an amplification/polarity-reverse circuit, a serial-parallel conversion circuit, a rotation circuit, a gamma correction circuit, and a clamping circuit. The display information processing circuit 1002 serially generates digital signals, based on input display information, which are inputted according to the clock signals, and then outputs the digital signals together with the clock signals CLK to the driving circuit 1004. The driving circuit 1004 is operative to drive the electro-optical device 100. The power supply circuit 1010 supplies electric power to each of the aforementioned circuits. Incidentally, the driving circuit 1004 may be mounted on the TFT array substrate of the electro-optical device 100. Additionally, the display information processing circuit 1002 may be also mounted thereon.

Figure 16:
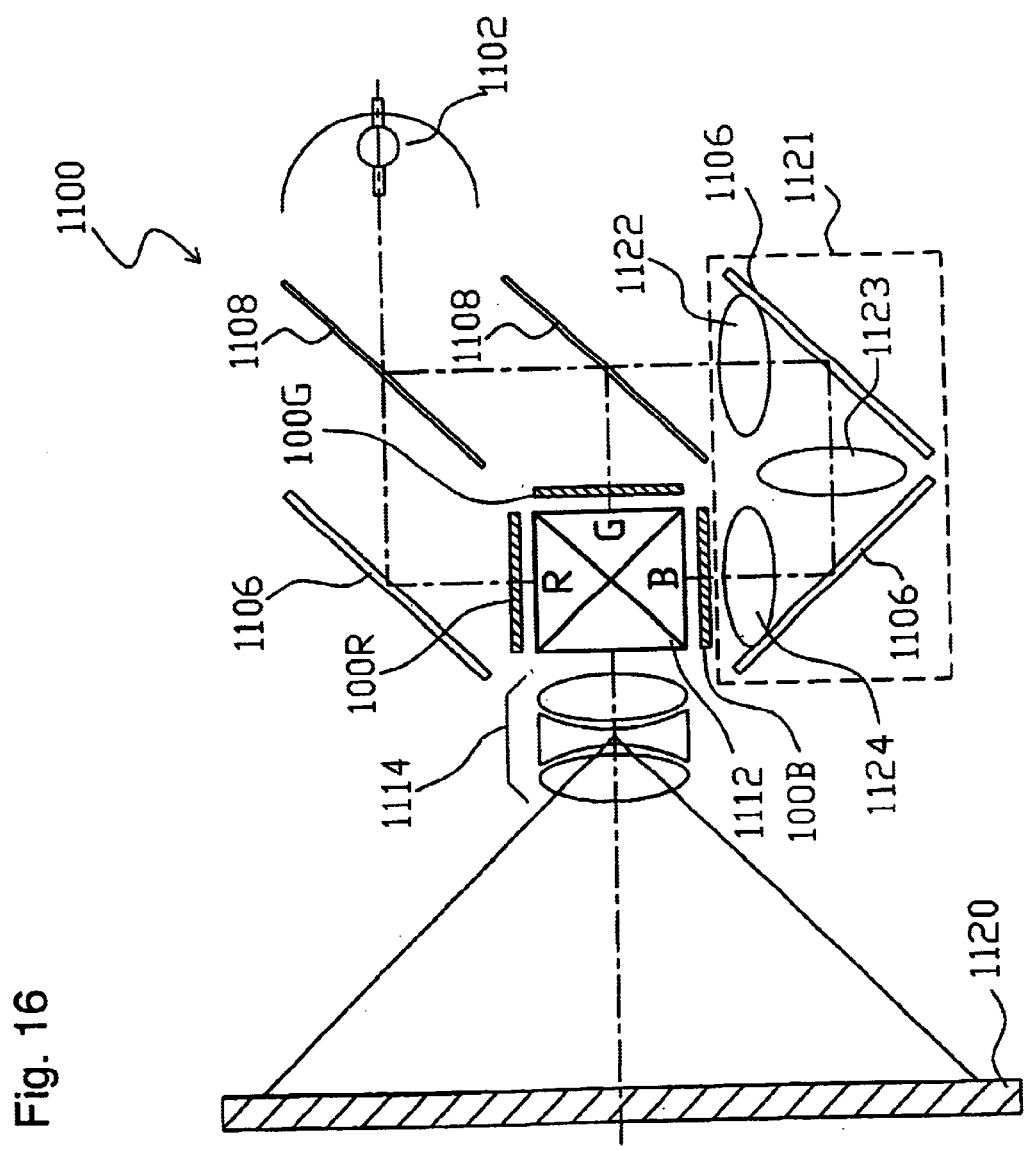
FIG. 16 is a sectional diagram illustrating a projector as an example of the electronic equipment.

Referring next to FIGS. 16 ad 17, there are shown practical examples of the electronic equipment constructed in this manner.

As shown in FIG. 16, in the case of a projector 1100 serving as an example of the electronic equipment, three light valves including the electro-optical device 100 having the driving circuit 1004 mounted on the TFT array substrate are prepared. This projector is constructed so that these light valves are used as a light valve for R light rays, a light valve for G light rays, and a light valve for B light rays, respectively. In the projector 1100, projection light emitted from a lamp unit 1102, such as a metal halide lamp, serving as a white light source is separated by three mirrors 1106 and two dichroic mirrors 1108 into light components R, G, and B respectively corresponding to primaries RGB. These components R, G, and B are led into the light valves 100R, 100G, and 100B, respectively corresponding thereto. At that time, especially, the blue light component B is led thereto through a relay lens system 1121 consisting of an incidence lens 1122, a relay lens 1123, and an output lens 1124, so as to prevent optical loss due to a long optical path. Then, projection light is synthesized again from the light components, which are respectively modulated by the light valves 100R, 100G, and 100B and correspond to the primaries. Subsequently, the projection light is projected through the projection lens 1114 on a screen 1120 as a color image.

Figure 17:
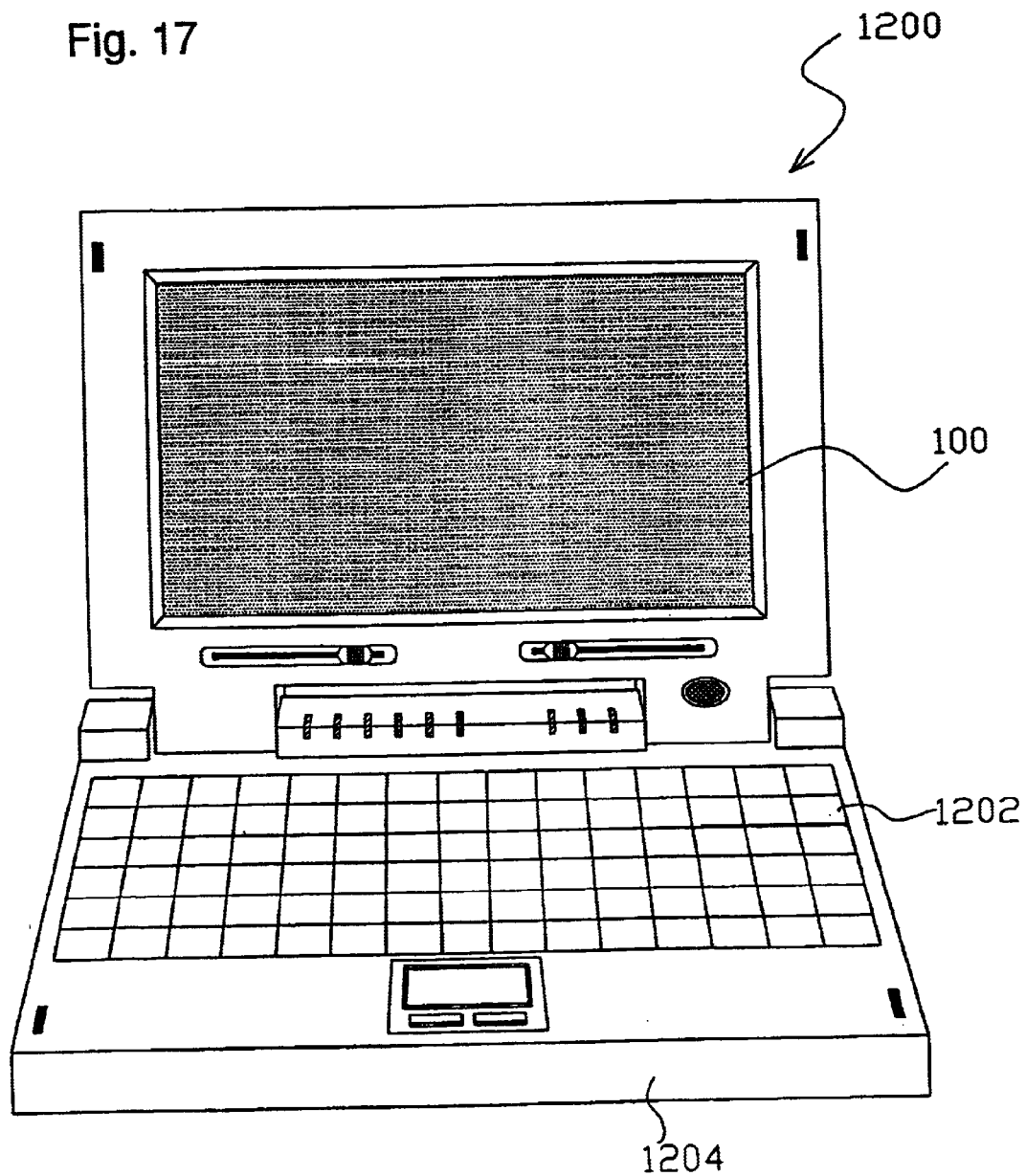
FIG. 17 is a front diagram illustrating a personal computer as another example of the electronic equipment

As shown in FIG. 17, a multi-media-capable laptop personal computer (PC) 1200, which is another example of the electronic equipment, has the aforementioned electro-optical device 100 provided in a top cover case, and further contains a CPU, a memory, and a modem, and further a main unit 1204 into which a keyboard 1202 is incorporated.

In addition to the examples of the electronic equipment described with reference to FIGS. 16 and 17, a liquid crystal television set, a view finder type or monitor-direct-view type video tape recorder, a car navigation device, an electronic notepad, an electronic calculator, a word processor, an engineering work station (EWS), a hand-portable telephone set, a POS terminal, and a device having a touch panel are cited as examples of the electronic equipment shown in FIG. 15.

As described above, according to this embodiment, various kinds of electronic equipment having the electro-optical device, which can provide a high-picture-quality image and have high manufacturing efficiency, are realized.

Industrial Applicability

As described above, according to the first electro-optical device of the present invention, the picture quality of a displayed image of the electro-optical device can be improved, and the layout flexibility can be increased, and the stability and reliability of the device can be enhanced, the facilitation of the manufacturing process can be achieved from various viewpoints by a conductive layer formed at a specific position in a laminated layer structure.

According to the second electro-optical device of the present invention, the picture quality of a displayed image of the electro-optical device can be improved, and the layout flexibility can be increased, and the stability and reliability of the device can be enhanced, the facilitation of the manufacturing process can be achieved from various viewpoints by thin film transistors formed under the scanning lines, and a conductive layer formed beside the thin film transistor and at a specific position in a laminated layer structure which contains storage capacitors under storage capacitor lines.

According to the third electro-optical device of the present invention, storage capacitance can be easily and efficiently increased by utilizing the second dielectric film, which can be made to be a thin film independent of the parasitic capacitance between the data lines and the scanning lines. Thus, flickers due to insufficiency of the storage capacitance can be reduced. Moreover, the contrast ratio can be enhanced. Especially, when the accuracy of the device is increased to an extremely high level, and the size of the device is reduced to an extremely small value, sufficient storage capacitance is added to the device. Further, the electrical connection between the pixel electrode and the drain region can be easily provided by the buffering function of the conductive layer. Moreover, the diameters of the contact holes can be decreased. Furthermore, the diameters thereof can be reduced still more with a decrease in the thickness of the first or second dielectric film. Thus, the pixel aperture ratio can be improved owing to the presence of the contact hole. Additionally, occurrences of disclination in the electro-optical materials can be prevented. Further, the second contact hole can be formed at an arbitrary position on a plane in a region, if a projection of the data lines on the plane and a projection of the conductive layer on the plane are present in a projection of the region on the plane. Thus, the flexibility of the position, at which the second contact hole is formed, is considerably enhanced. Consequently, the flexibility of designing the layout on the plane is exceedingly increased. The device of the present invention is very convenient for practical use.

Further, according to the method for manufacturing the electro-optical device of the present invention, the electro-optical device of the present invention can be manufactured by performing a relatively small number of steps, in each of which a relatively simple operation is performed.

What is claimed is:

1. An electro-optical device, comprising:
    a plurality of scanning lines and a plurality of data lines;
    a thin film transistor disposed corresponding to intersection between a scanning line and a data line;
    a pixel electrode disposed in correspondence with the thin film transistor,
    a storage capacitor disposed in correspondence with the pixel electrode;
    a first storage capacitor electrode of the storage capacitor formed in a drain region of a semiconductor of the thin film transistor, extended along the scanning line and the data line;
    a second storage capacitor electrode formed with a same film of a gate electrode of the thin film transistor, extended along the scanning line and the data line, and opposed to the first storage capacitor electrode; and
    a conductive light-shielding film electrically connected to the drain of the semiconductor, disposed in an upper layer than the second storage capacitor electrode,
    the pixel electrode being electrically connected to the light-shielding film, disposed in the upper layer than the light-shielding film, the storage capacitor being formed along the scanning line and the data line.

2. The electro-optical device according to claim 1, the light-shielding film being formed along a direction of scanning line between adjacent data lines.

3. The electro-optical device according to claim 1, further comprises a lower light-shielding film covering the semiconductor, overlapping to the light-shielding film, and disposed in a lower layer than the semiconductor.

4. An electronic-equipment comprising the electro-optical device recited in claim 1.

5. An electro-optical device, comprising:
    a plurality of scanning lines and a plurality of data lines;
    a thin film transistor disposed corresponding to intersection between a scanning line and a data line;
    a pixel electrode disposed in correspondence with the thin film transistor;
    a storage capacitor disposed in correspondence with the pixel electrode;
    a first storage capacitor electrode of the storage capacitor formed in a drain region of a semiconductor of the thin film transistor, extended along the scanning line and the data line;
    a second storage capacitor electrode formed with a same film of a gate electrode of the thin film transistor, extended along the scanning line and the data line, and opposed to the first storage capacitor electrode;
    a conductive film electrically connected to the drain of the semiconductor, disposed in an upper layer than the second storage capacitor electrode,
    the pixel electrode being electrically connected to the conductive film, disposed in the upper layer than the conductive film via an insulating film; and
    another insulating film disposed below the pixel electrode being formed so that the top surface thereof is flat, the storage capacitor being formed along the scanning line and the data line.

6. The electro-optical device according to claim 5, the conductive film being opposed to the second storage capacitor electrode as a third storage capacitor electrode.

7. An electronic-equipment comprising the electro-optical device recited in claim 5.

* * * * *